(12) United States Patent
Kobayashi et al.

(10) Patent No.: US 6,830,866 B2
(45) Date of Patent: Dec. 14, 2004

(54) RESIST COMPOSITION AND PATTERNING PROCESS

(75) Inventors: Tomohiro Kobayashi, Niigata-ken (JP); Tsunehiro Nishi, Niigata-ken (JP); Satoshi Watanabe, Niigata-ken (JP); Takeshi Kinsho, Niigata-ken (JP); Shigehiro Nagura, Niigata-ken (JP); Toshinobu Ishihara, Niigata-ken (JP)

(73) Assignee: Shi-Etsu Chemical Co., Ltd., Tokyo (JP)

( * ) Notice: Subject to any disclaimer, the term of this patent is extended or adjusted under 35 U.S.C. 154(b) by 79 days.

(21) Appl. No.: 10/170,345

(22) Filed: Jun. 14, 2002

(65) Prior Publication Data

US 2003/0013039 A1 Jan. 16, 2003

(30) Foreign Application Priority Data

Jun. 15, 2001 (JP) ........................................ 2001-181079

(51) Int. Cl.$^7$ .............................................. G03F 7/038
(52) U.S. Cl. .................... 430/270.1; 430/296; 430/325; 430/330
(58) Field of Search ............................. 430/270.1, 296, 430/325, 330

(56) References Cited

U.S. PATENT DOCUMENTS

| | | | | |
|---|---|---|---|---|
| 4,506,003 A | * | 3/1985 | Ruckert et al. | 430/270.1 |
| 6,280,898 B1 | * | 8/2001 | Hasegawa et al. | 430/270.1 |
| 6,383,713 B1 | * | 5/2002 | Uetani et al. | 430/270.1 |
| 6,479,592 B2 | * | 11/2002 | Rheinberger et al. | 525/205 |
| 6,524,765 B1 | * | 2/2003 | Nishi et al. | 430/270.1 |
| 6,605,408 B2 | * | 8/2003 | Nishi et al. | 430/270.1 |
| 2003/0108819 A1 | * | 6/2003 | Watanabe et al. | 430/311 |

FOREIGN PATENT DOCUMENTS

JP         2000-159758         6/2000

* cited by examiner

*Primary Examiner*—Yvette C. Thornton
(74) *Attorney, Agent, or Firm*—Millen, White, Zelano, Branigan, P.C.

(57) ABSTRACT

A resist composition comprising a hydrogenated product of ring-opening metathesis polymer and a poly(meth)acrylic acid derivative as a base resin is sensitive to high-energy radiation, has excellent sensitivity, resolution, and etch resistance, and lends itself to micropatterning with electron beams or deep-UV.

14 Claims, No Drawings

RESIST COMPOSITION AND PATTERNING PROCESS

This invention relates to a resist composition and a patterning process using the resist composition.

BACKGROUND OF THE INVENTION

While a number of recent efforts are being made to achieve a finer pattern rule in the drive for higher integration and operating speeds in LSI devices, deep-ultraviolet lithography is thought to hold particular promise as the next generation in microfabrication technology. In particular, photolithography using a KrF or ArF excimer laser as the light source is strongly desired to reach the practical level as the micropatterning technique capable of achieving a feature size of 0.3 µm or less.

For resist materials for use with a KrF excimer lasers, polyhydroxystyrene having a practical level of transmittance and etching resistance is, in fact, a standard base resin. For resist materials for use with ArF excimer lasers, polyacrylic or polymethacrylic acid derivatives and polymers containing aliphatic cyclic compounds in the backbone are under investigation. All these polymers have advantages and disadvantages, and none of them have been established as the standard base resin.

More particularly, resist compositions using derivatives of polyacrylic or polymethacrylic acid have the advantages of high reactivity of acid-decomposable groups and good substrate adhesion and give relatively satisfactory results with respect to sensitivity and resolution, but have extremely low etching resistance and are impractical because the resin backbone is weak. On the other hand, resist compositions using polymers containing alicyclic compounds in their backbone have a practically acceptable level of etching resistance because the resin backbone is robust, but are very low in sensitivity and resolution because the reactivity of acid-decomposable protective groups is extremely low as compared with those on the (meth)acrylic polymers. Poor substrate adhesion because of the too robust backbone of the resin and a likelihood of swelling due to high hydrophobicity are also problematic. These compositions are thus impractical as well.

In the prior art, attempts were also made to combine polymers of different types as a base resin. However, in many cases, particularly when polymers of different backbone structures are combined, many such polymers are not compatible with each other and do not form homogeneous resist solutions. A resist solution, if obtained, gives rise to phase separation or clouding upon coating, failing to form a satisfactory film. Even when a resist film is formed, partial stripping can occur, due to an uneven distribution of the base resins, during the patterning step.

SUMMARY OF THE INVENTION

Therefore, an object of the present invention is to provide a resist composition having a high resolution and etch resistance and useful in precise micropatterning, and a patterning process using the resist composition.

It has been found that by using as a base resin in a resist composition a hydrogenated product of a ring-opening metathesis polymer having excellent etch resistance among polymers containing an alicyclic compound in the backbone, and combining a poly(meth)acrylic acid derivative in part with it, an outstanding improvement in resolution is achievable, and the etch resistance, though experiencing a slight decline, is maintained within the practically acceptable range. When a polymer having a specific structure containing an oxygen atom within the backbone as shown by the general formula (1) below is used as the hydrogenated product of a ring-opening metathesis polymer, the polymers are more compatible with each other so that a more improvement in resolution is achievable.

In a first aspect, the invention provides a resist composition comprising a hydrogenated product of a ring-opening metathesis polymer and a poly(meth)acrylic acid derivative as a base resin.

Preferably, the hydrogenated product of ring-opening metathesis polymer is a polymer comprising recurring units of the following general formula (1) and having a weight average molecular weight of 500 to 200,000.

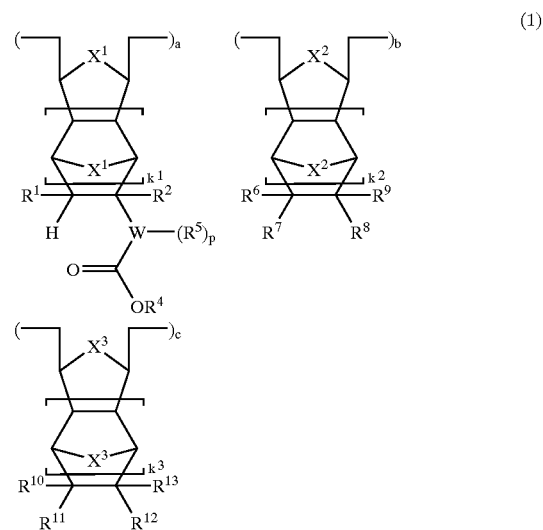

Herein $R^1$ is hydrogen, methyl or $CH_2CO_2R^3$; $R^2$ is hydrogen, methyl or $CO_2R^3$; $R^3$ which may be identical or different between $R^1$ and $R^2$ is a straight, branched or cyclic alkyl group of 1 to 15 carbon atoms; $R^4$ is an acid labile group; $R^5$ is a halogen atom, a hydroxyl group, a straight, branched or cyclic alkoxy, acyloxy or alkylsulfonyloxy group having 1 to 15 carbon atoms, or a straight, branched or cyclic alkoxycarbonyloxy or alkoxyalkoxy group having 2 to 15 carbon atoms, in which some or all of the hydrogen atoms on constituent carbon atoms may be substituted with halogen atoms; at least one of $R^6$ to $R^9$ is a monovalent hydrocarbon group of 1 to 15 carbon atoms having a carboxyl or hydroxyl group while the remaining R's are independently hydrogen or straight, branched or cyclic alkyl groups of 1 to 15 carbon atoms, or $R^6$ to $R^9$, taken together, may form a ring, and in that event, at least one of $R^6$ to $R^9$ is a divalent hydrocarbon group of 1 to 15 carbon atoms having a carboxyl or hydroxyl group while the remaining R's are independently single bonds or straight, branched or cyclic alkylene groups of 1 to 15 carbon atoms; at least one of $R^{10}$ to $R^{13}$ is a monovalent hydrocarbon group of 2 to 15 carbon atoms containing at least one partial structure selected from among ether, aldehyde, ketone, ester, carbonate, acid anhydride, amide and imide while the remaining R's are independently hydrogen or straight, branched or cyclic alkyl groups of 1 to 15 carbon atoms, or $R^{10}$ to $R^{13}$, taken together, may form a ring, and in that event, at least one of $R^{10}$ to $R^{13}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms; $X^1$ to $X^3$ each are independently a methylene group or oxygen atom, with the proviso that all $X^1$ to $X^3$ are not methylene groups at the same time; W is a single bond or a straight, branched or cyclic (p+2)-valent hydrocarbon group having 1 to 5 carbon atoms, in which at least one methylene group may be substituted with an oxygen atom to form a chain-like or cyclic ether or two hydrogen atoms on a common carbon may be substituted with an oxygen atom to form a ketone; $k^1$ to $k^3$ each are independently 0 or 1, p is 0, 1 or 2, "a," "b" and "c" representative of compositional ratios of the corresponding recurring units are such numbers that 0<a<1, 0≦b<1, 0≦c<1 and a+b+c=1. The recurring units introduced in the respective compositional ratios "a," "b" and "c" each may be of one or more types.

In a second aspect, the invention provides a process for forming a resist pattern comprising the steps of applying the resist composition of claim 1 or 2 onto a substrate to form a coating; heat treating the coating and then exposing it to high-energy radiation or electron beam through a photo mask; and optionally heat treating the exposed coating and developing it with a developer.

As mentioned above, resist compositions using as a base resin polymers containing an alicyclic compound in the backbone have good etch resistance, but are far inferior in resolution to resist compositions using as a base resin poly(meth)acrylic acid derivatives, and give rise to pattern stripping due to excessive hydrophobicity and pattern disruption due to swelling. In our research to overcome these drawbacks, a hydrogenated product of ring-opening metathesis polymer having excellent etch resistance is selected among other polymers containing an alicyclic compound in the backbone, as a base resin in a resist composition, and combined in part with a poly(meth)acrylic acid derivative. It has been ascertained that an outstanding improvement in resolution is then achieved. The etch resistance, though experiencing a slight decline, is maintained within the practically acceptable range. It has also been ascertained that when a polymer having a specific structure containing an oxygen atom within the backbone as shown by the general formula (1) below is used as the hydrogenated product of ring-opening metathesis polymer, the polymers are more compatible with each other so that a more improvement in resolution is achievable.

The technique of combining polymers of plural types as the base resin is per se known in the art. However, in many cases, particularly when polymers of different backbone structures are combined, they are not fully compatible with each other and do not form homogeneous resist solutions. A resist solution, if obtained, gives rise to phase separation or clouding upon coating, failing to form a satisfactory film. Even when a resist film is formed, partial stripping can occur, due to an uneven distribution of the base polymers, during the patterning step. Therefore, the technique of combining a hydrogenated product of ring-opening metathesis polymer having a specific structure with a poly(meth) acrylic acid derivative as a base resin according to the present invention apparently has originality, superiority and inventive step over the prior art.

DESCRIPTION OF THE PREFERRED EMBODIMENT

The resist composition of the present invention is characterized by comprising a hydrogenated product of ring-opening metathesis polymer and a poly(meth)acrylic acid derivative both as a base resin.

Polymers

In a preferred embodiment, the hydrogenated product of ring-opening metathesis polymer used herein is a polymer comprising recurring units of the following general formula (1) and having a weight average molecular weight (Mw) of 500 to 200,000.

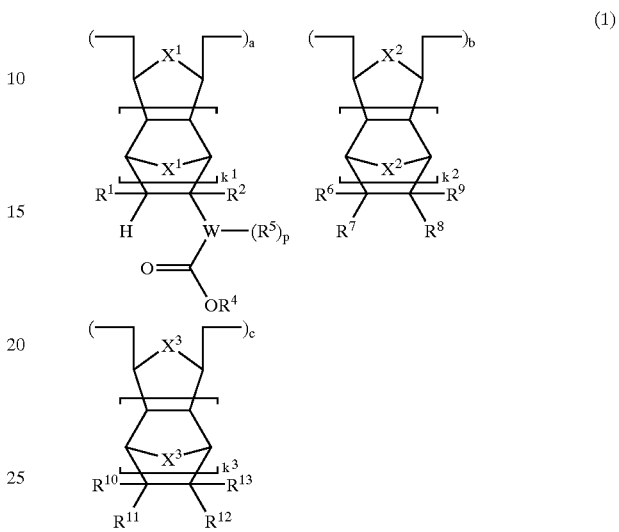

Herein $R^1$ is hydrogen, methyl or $CH_2CO_2R^3$. $R^2$ is hydrogen, methyl or $CO_2R^3$. $R^3$ which may be identical or different between $R^1$ and $R^2$ is a straight, branched or cyclic alkyl group of 1 to 15 carbon atoms. $R^4$ is an acid labile group. $R^5$ is a halogen atom, a hydroxyl group, a straight, branched or cyclic alkoxy, acyloxy or alkylsulfonyloxy group having 1 to 15 carbon atoms, or a straight, branched or cyclic alkoxycarbonyloxy or alkoxyalkoxy group having 2 to 15 carbon atoms, in which some or all of the hydrogen atoms on constituent carbon atoms may be substituted with halogen atoms. At least one of $R^6$ to $R^9$ is a monovalent hydrocarbon group of 1 to 15 carbon atoms containing a carboxyl or hydroxyl group while the remaining R's are independently hydrogen or straight, branched or cyclic alkyl groups of 1 to 15 carbon atoms, or $R^6$ to $R^9$, taken together, may form a ring, and in that event, at least one of $R^6$ to $R^9$ is a divalent hydrocarbon group of 1 to 15 carbon atoms containing a carboxyl or hydroxyl group while the remaining R's are independently single bonds or straight, branched or cyclic alkylene groups of 1 to 15 carbon atoms. At least one of $R^{10}$ to $R^{13}$ is a monovalent hydrocarbon group of 2 to 15 carbon atoms containing at least one partial structure selected from among ether, aldehyde, ketone, ester, carbonate, acid anhydride, amide and imide while the remaining R's are independently hydrogen or straight, branched or cyclic alkyl groups of 1 to 15 carbon atoms, or $R^{10}$ to $R^{13}$, taken together, may form a ring, and in that event, at least one of $R^{10}$ to $R^{13}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms. $X^1$ to $X^3$ each are independently a methylene group or oxygen atom, with the proviso that all $X^1$ to $X^3$ are not methylene groups at the same time. W is a single bond or a straight, branched or cyclic (p+2)-valent hydrocarbon group having 1 to 5 carbon atoms, in which at least one methylene group may be substituted with an oxygen atom to form a chain-like or cyclic ether or in which two hydrogen atoms on a common carbon may be substituted with an oxygen atom to form a ketone. Letters $k^1$ to $k^3$ each are independently 0 or 1, p is 0, 1 or 2, "a," "b" and "c" representative of compositional ratios of the corresponding recurring units are such numbers that $0<a<1, 0\leqq b<1, 0\leqq c<1$ and $a+b+c=1$. The recurring units introduced in the respective compositional ratios "a," "b" and "c" each may be of one or more types.

More particularly, $R^1$ is hydrogen, methyl or $CH_2CO_2R^3$. $R^2$ is hydrogen, methyl or $CO_2R^3$. $R^3$ stands for straight, branched or cyclic alkyl groups of 1 to 15 carbon atoms, such as, for example, methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl and butyladamantyl. $R^4$ stands for acid labile groups to be described later.

$R^5$ is a halogen atom, a hydroxyl group, a straight, branched or cyclic alkoxy, acyloxy or alkylsulfonyloxy group of 1 to 15 carbon atoms, or a straight, branched or cyclic alkoxycarbonyloxy or alkoxyalkoxy group of 2 to 15 carbon atoms, in which some or all of the hydrogen atoms on constituent carbon atoms may be substituted with halogen atoms. Exemplary of $R^5$ are fluoro, chloro, bromo, hydroxy, methoxy, ethoxy, propoxy, isopropoxy, n-butoxy, sec-butoxy, tert-butoxy, tert-amyloxy, n-pentoxy, n-hexyloxy, cyclopentyloxy, cyclohexyloxy, ethylcyclopentyloxy, butylcyclopentyloxy, ethylcyclohexyloxy, butylcyclohexyloxy, adamantyloxy, ethyladamantyloxy, butyladamantyloxy, formyloxy, acetoxy, ethylcarbonyloxy, pivaloyloxy, methanesulfonyloxy, ethanesulfonyloxy, n-butanesulfonyloxy, trifluoroacetoxy, trichloroacetoxy, 2,2,2-trifluoroethylcarbonyloxy, methoxymethoxy, 1-ethoxyethoxy, 1-ethoxypropoxy, 1-tert-butoxyethoxy, 1-cyclohexyloxyethoxy, 2-tetrahydrofuranyloxy, 2-tetrahydropyranyloxy, methoxycarbonyloxy, ethoxycarbonyloxy, and tert-butoxycarbonyloxy.

At least one of $R^6$ to $R^9$ represents a monovalent hydrocarbon group of 1 to 15 carbon atoms containing a carboxyl or hydroxyl group while the remaining R's independently represent hydrogen or a straight, branched or cyclic alkyl group of 1 to 15 carbon atoms. Examples of the carboxyl or hydroxyl-bearing monovalent hydrocarbon group of 1 to 15 carbon atoms include carboxy, carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, and hydroxyadamantyloxycarbonyl. Examples of the straight, branched or cyclic alkyl group of 1 to 15 carbon atoms are the same as exemplified for $R^3$. Alternatively, $R^6$ to $R^9$, taken together, may form a ring, and in that event, at least one of $R^6$ to $R^9$ is a divalent hydrocarbon group of 1 to 15 carbon atoms containing a carboxyl or hydroxyl group, while the remaining R's are independently single bonds or straight, branched or cyclic alkylene groups of 1 to 15 carbon atoms. Examples of the carboxyl or hydroxyl-bearing divalent hydrocarbon group of 1 to 15 carbon atoms include the groups exemplified as the carboxyl or hydroxyl-bearing monovalent hydrocarbon group, with one hydrogen atom eliminated therefrom. Examples of the straight, branched or cyclic alkylene groups of 1 to 15 carbon atoms include the groups exemplified for $R^3$, with one hydrogen atom eliminated therefrom.

At least one of $R^{10}$ to $R^{13}$ is a monovalent hydrocarbon group of 2 to 15 carbon atoms containing at least one partial structure selected from among ether, aldehyde, ketone, ester, carbonate, acid anhydride, amide and imide, while the remaining R's are independently hydrogen or straight, branched or cyclic alkyl groups of 1 to 15 carbon atoms. Examples of the monovalent hydrocarbon group of 2 to 15 carbon atoms containing at least one partial structure selected from among ether, aldehyde, ketone, ester, carbonate, acid anhydride, amide and imide include methoxymethyl, methoxymethoxymethyl, formyl, methylcarbonyl, formyloxy, acetoxy, pivaloyloxy, formyloxymethyl, acetoxymethyl, pivaloyloxymethyl, methoxycarbonyl, 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Examples of the straight, branched or cyclic alkyl groups of 1 to 15 carbon atoms are the same as exemplified for $R^3$. Alternatively, $R^{10}$ to $R^{13}$, taken together, may form a ring, and in that event, at least one of $R^{10}$ to $R^{13}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms. Examples of the divalent hydrocarbon group of 1 to 15 carbon atoms containing at least one partial structure selected from among ether, aldehyde, ketone, ester, carbonate, acid anhydride, amide and imide include 2-oxapropane-1,3-diyl, 1,1-dimethyl-2-oxapropane-1,3-diyl, 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as the groups exemplified as the monovalent hydrocarbon group of 1 to 15 carbon atoms containing at least one partial structure selected from among ether, aldehyde, ketone, ester, carbonate, acid anhydride, amide and imide, with one hydrogen atom eliminated therefrom. Examples of the straight, branched or cyclic alkylene groups of 1 to 15 carbon atoms include the groups exemplified for $R^3$, with one hydrogen atom eliminated therefrom.

$X^1$ to $X^3$ each are independently a methylene group or an oxygen atom, with the proviso that all $X^1$ to $X^3$ are not methylene groups at the same time.

W is a single bond or a straight, branched or cyclic (p+2)-valent hydrocarbon group having 1 to 5 carbon atoms, in which at least one methylene group may be substituted with an oxygen atom to form a chain-like or cyclic ether or two hydrogen atoms on a common carbon may be substituted with an oxygen atom to form a ketone. In case of p=0, for example, exemplary W groups are methylene, ethylene, trimethylene, tetramethylene, pentamethylene, 1,2-propanediyl, 1,3-butanediyl, 1-oxo-2-oxapropane-1,3-diyl, and 3-methyl-1-oxo-2-oxabutane-1,4-diyl. In case of p≠0, exemplary W groups are (p+2)-valent groups obtained by eliminating one or two hydrogen atoms from the above-exemplified groups.

Letters $k^1$ to $k^3$ each are independently 0 or 1; p is 0, 1 or 2; "a," "b" and "c" representative of compositional ratios of the corresponding recurring units are such numbers that $0<a<1, 0\leqq b<1, 0\leqq c<1$ and $a+b+c=1$. The preferred ranges of "a," "b" and "c" are: $0.1\leqq a\leqq 0.9, 0\leqq b\leqq 0.8,$ and $0 \leq c \leq 0.8$, more preferably $0.2 \leq a \leq 0.8$, $0 \leq b \leq 0.7$, and $0 \leq c \leq 0.7$, and most preferably $0.3 \leq a \leq 0.7$, $0 \leq b \leq 0.6$, and $0 \leq c \leq 0.6$.

The recurring units introduced in the respective compositional ratios "a," "b" and "c" each may be of one or more types. As the compositional ratio of the respective recurring units changes, various properties including developer affinity, substrate adhesion and etch resistance change as well. Then a proper choice of a, b and c values allows for fine adjustment of the resist composition's performance.

The acid labile groups represented by $R^4$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

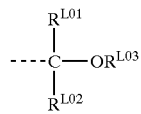
(L1)

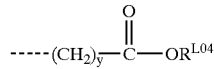
(L2)

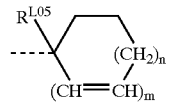
(L3)

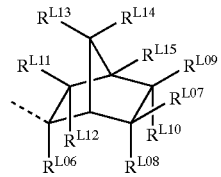
(L4)

In these formulae and throughout the specification, the broken line denotes a free valence bond. $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, and n-octyl. $R^{L03}$ is a monovalent hydrocarbon group of 1 to 18 carbon atoms, preferably 1 to 10 carbon atoms, which may contain a hetero atom such as oxygen, examples of which include unsubstituted straight, branched or cyclic alkyl groups and straight, branched or cyclic alkyl groups in which some hydrogen atoms are replaced by hydroxyl, alkoxy, oxo, amino, alkylamino or the like. Illustrative examples are the substituted alkyl groups shown below.

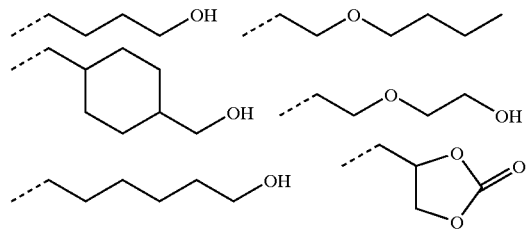

A pair of $R^{L01}$ and $R^{L02}$, $R^{L01}$ and $R^{L03}$, or $R^{L02}$ and $R^{L03}$ may bond together to form a ring. Each of $R^{L01}$, $R^{L02}$ and $R^{L03}$ is a straight or branched alkylene group of 1 to 18 carbon atoms, preferably 1 to 10 carbon atoms when they form a ring.

$R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl) propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, and 2-ethyl-2-adamantyl. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

$R^{L05}$ is a monovalent hydrocarbon group of 1 to 8 carbon atoms which may contain a hetero atom or a substituted or unsubstituted aryl group of 6 to 20 carbon atoms. Examples of the monovalent hydrocarbon group which may contain a hetero atom include straight, branched or cyclic alkyl groups such as methyl, ethyl, propyl, isopropyl, n-butyl, sec-butyl, tert-butyl, tert-amyl, n-pentyl, n-hexyl, cyclopentyl, and cyclohexyl, and substituted groups in which some hydrogen atoms on the foregoing groups are substituted with hydroxyl, alkoxy, carboxy, alkoxycarbonyl, oxo, amino, alkylamino, cyano, mercapto, alkylthio, sulfo or other groups. Exemplary aryl groups are phenyl, methylphenyl, naphthyl, anthryl, phenanthryl, and pyrenyl. Letter m is equal to 0 or 1, n is equal to 0, 1, 2 or 3, and 2m+n is equal to 2 or 3.

$R^{L06}$ is a monovalent hydrocarbon group of 1 to 8 carbon atoms which may contain a hetero atom or a substituted or unsubstituted aryl group of 6 to 20 carbon atoms. Examples of these groups are the same as exemplified for $R^{L05}$.

$R^{L07}$ to $R^{L16}$ independently represent hydrogen or monovalent hydrocarbon groups of 1 to 15 carbon atoms which may contain a hetero atom. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted ones of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, $R^{L07}$ to $R^{L16}$, taken together, form a ring (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$–$C_{15}$ hydrocarbon group which may contain a hetero atom, when they form a ring, examples of which are the ones exemplified above for the monovalent hydrocarbon groups, with one hydrogen atom being eliminated. Two of $R^{L07}$ to $R^{L16}$ which are attached to adjoining carbon atoms (for example, a pair of $R^{L07}$ and $R^{L09}$, $R^{L09}$ and $R^{L15}$, $R^{L13}$ and $R^{L15}$, or a similar pair) may bond together directly to form a double bond.

Of the acid labile groups of formula (L1), the straight and branched ones are exemplified by the following groups.

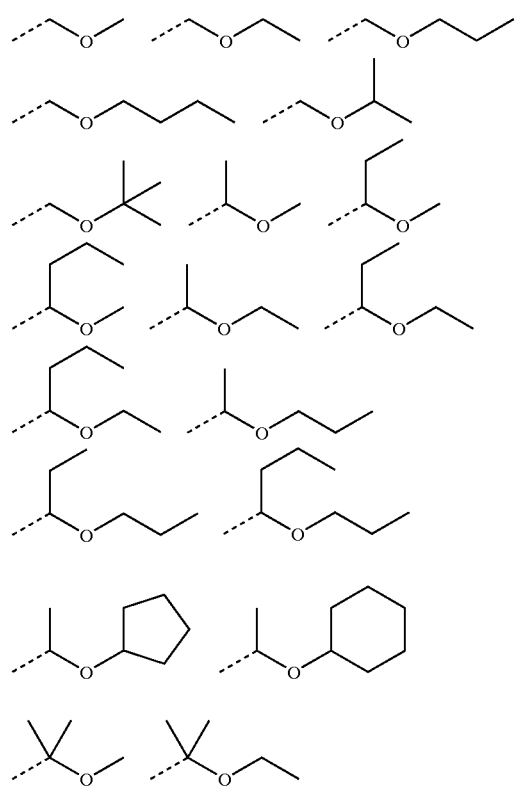

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, is 1,1-diethylpropyloxycarbonyl, 1,1-diethylpropyloxy-carbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxy-carbonylmethyl, 1-ethoxyethoxycarbonylmethyl, 2-tetrahydropyranyloxycarbonylmethyl, and 2-tetrahydrofuranyloxycarbonylmethyl groups.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl groups.

The acid labile groups of formula (L4) are exemplified by the following groups.

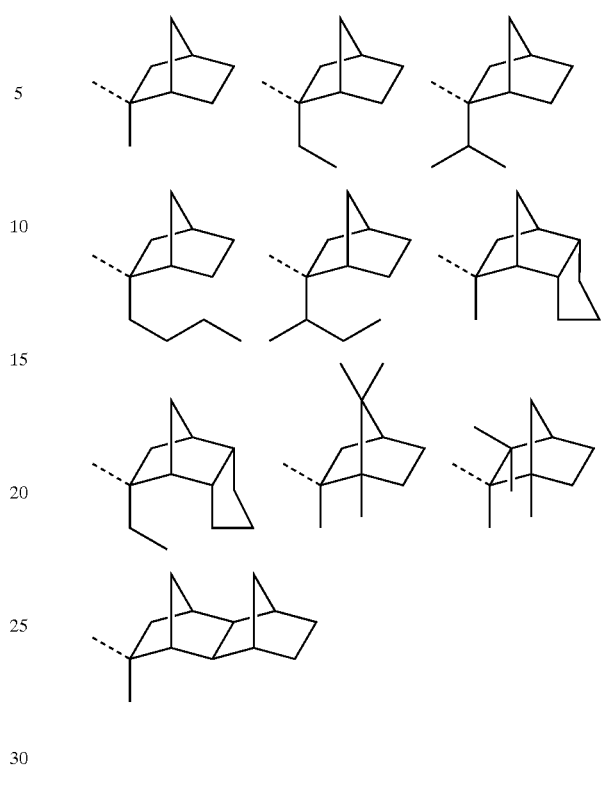

Examples of the tertiary alkyl groups of 4 to 20 carbon atoms, trialkylsilyl groups in which each alkyl moiety has 1 to 6 carbon atoms, and oxoalkyl groups of 4 to 20 carbon atoms are as exemplified for $R^{L04}$.

Illustrative, non-limiting, examples of the recurring units introduced in compositional ratio "a" in the hydrogenated product of ring-opening metathesis polymer of formula (1) are given below.

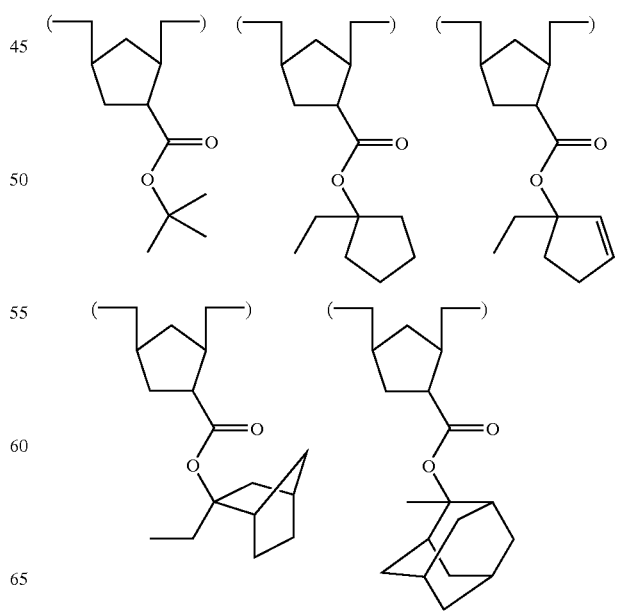

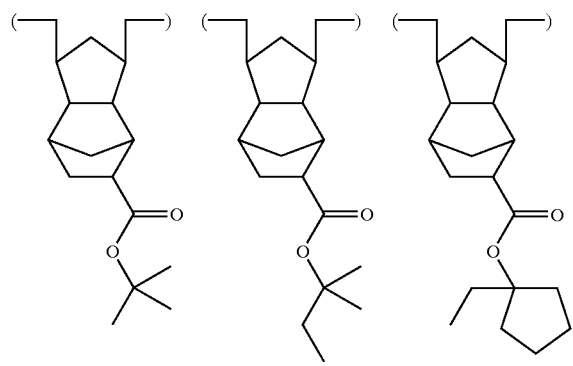
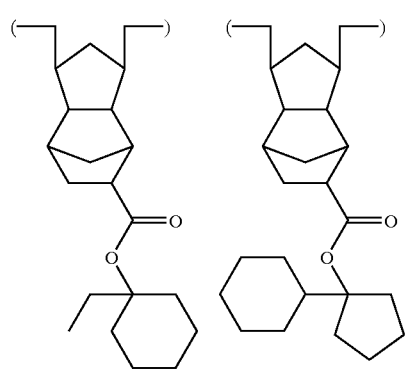
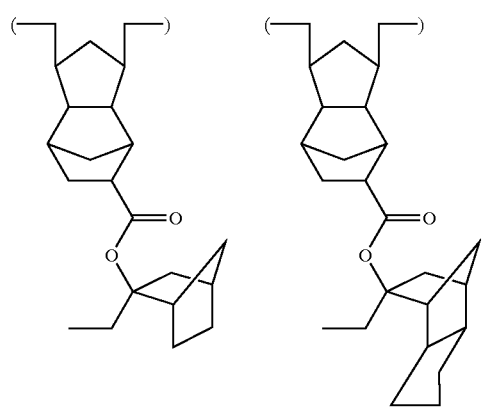
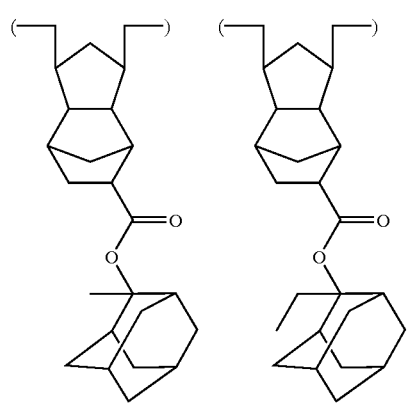
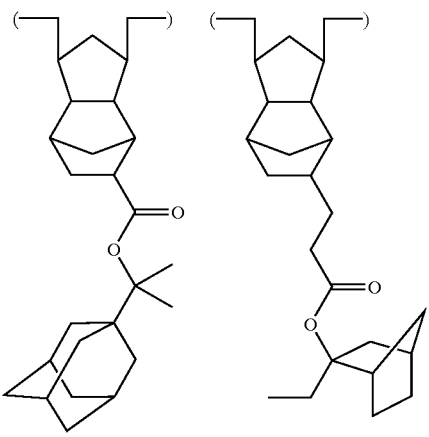
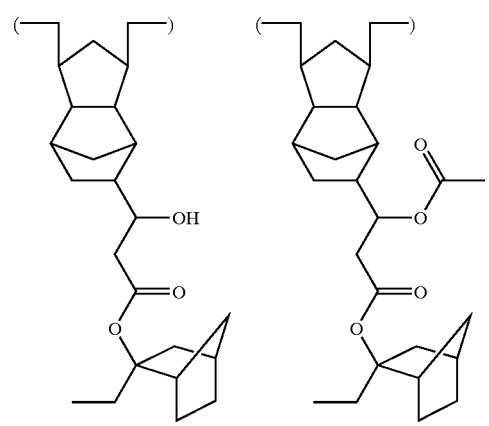
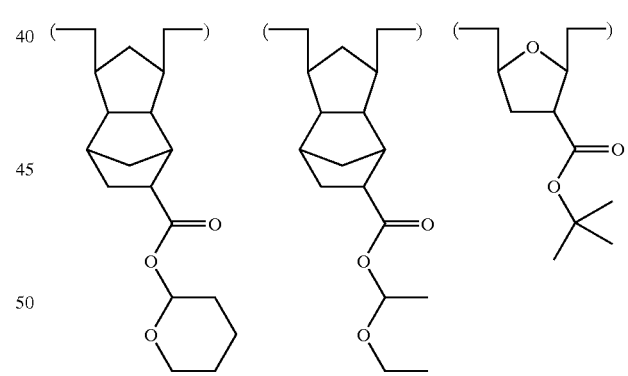
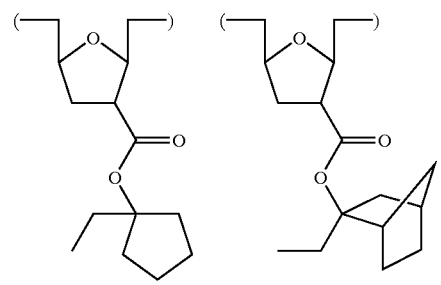

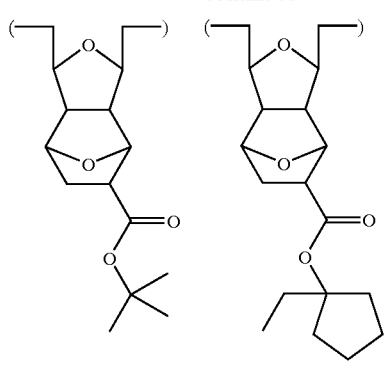

Illustrative, non-limiting, examples of the recurring units introduced in compositional ratio "b" in the hydrogenated product of ring-opening metathesis polymer of formula (1) are given below.

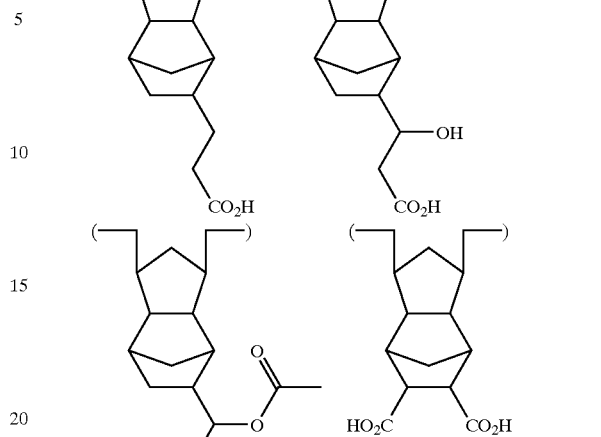

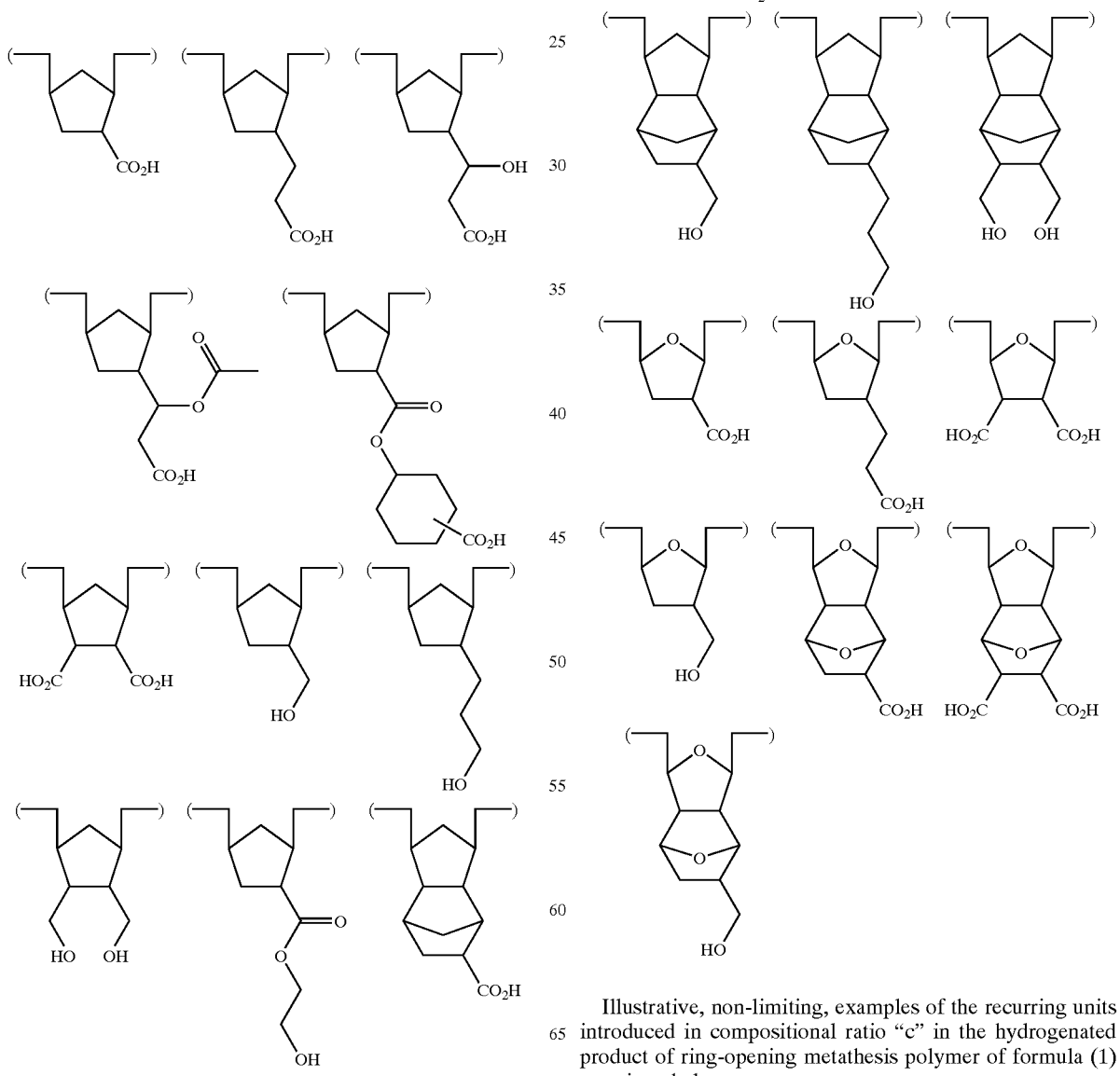

Illustrative, non-limiting, examples of the recurring units introduced in compositional ratio "c" in the hydrogenated product of ring-opening metathesis polymer of formula (1) are given below.

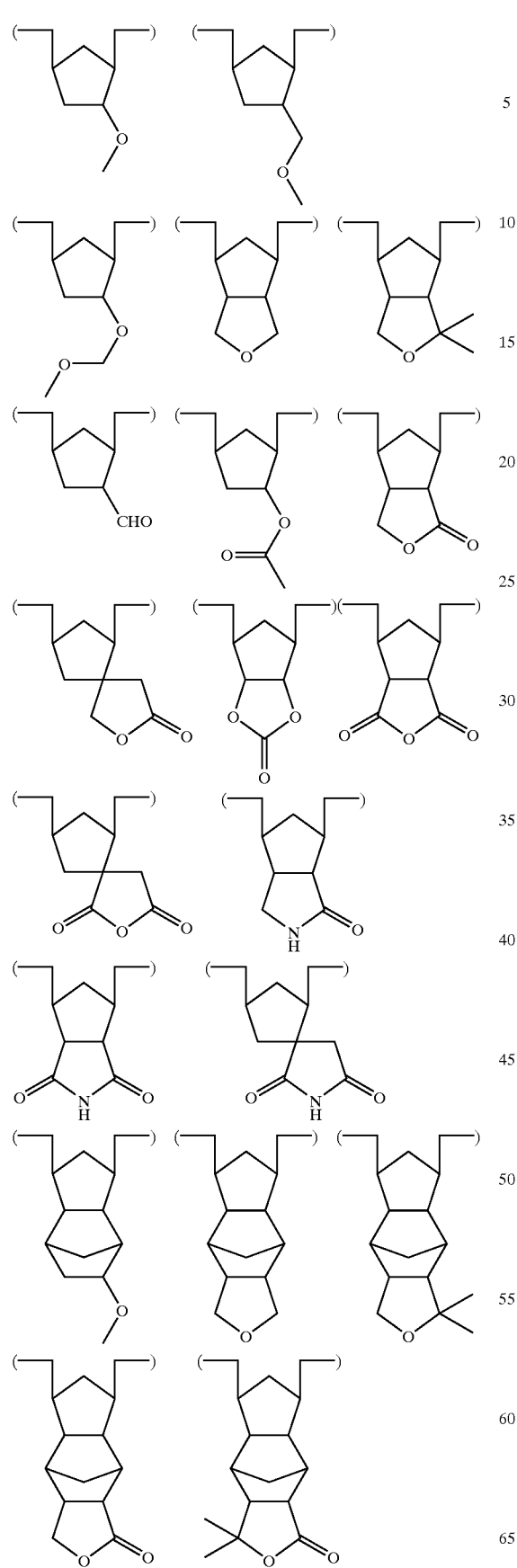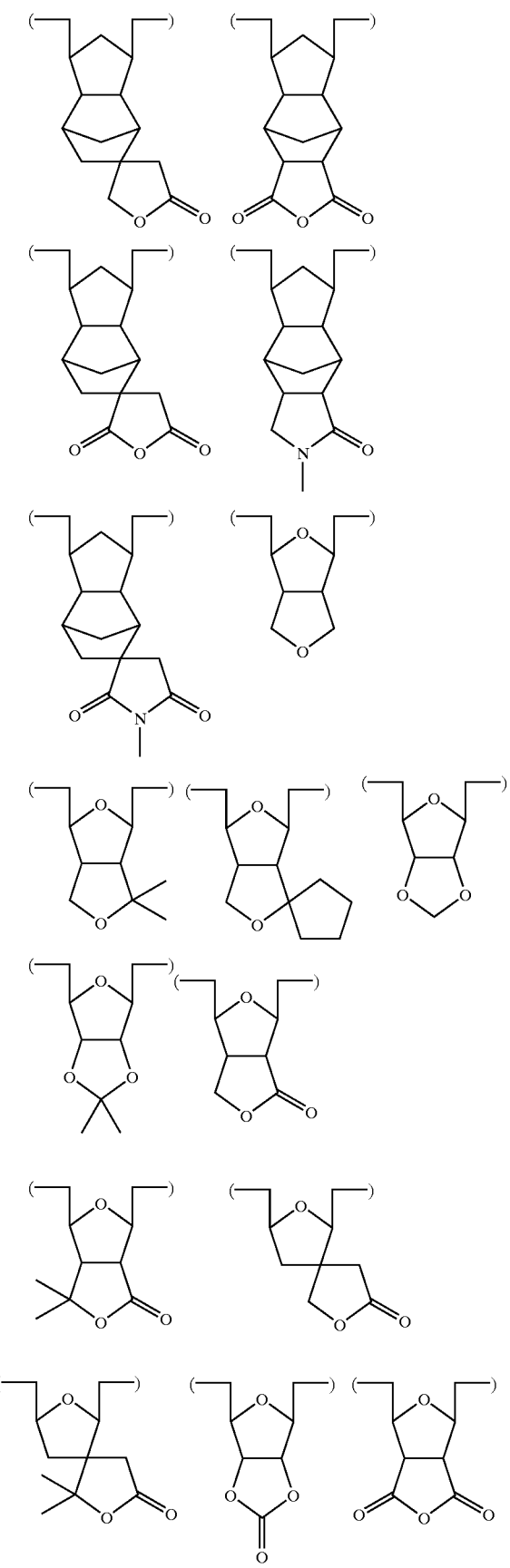

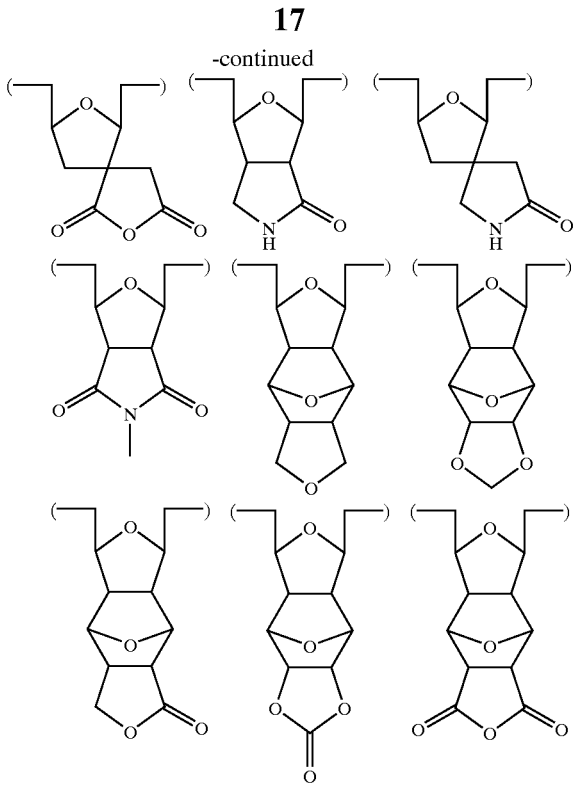

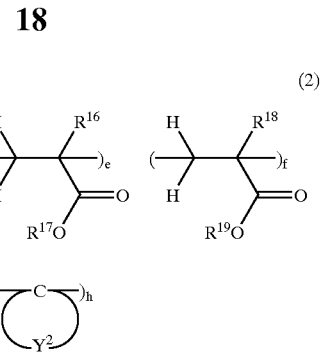

(2)

The hydrogenated products of ring-opening metathesis polymer used in the resist composition of the invention preferably have a weight average molecular weight (Mw) of about 500 to 200,000, and preferably about 3,000 to 20,000, as measured by gel permeation chromatography (GPC) using a polystyrene standard. Outside the range, the etch resistance may become extremely low and the resolution may become low because a substantial difference in rate of dissolution before and after exposure is lost.

The hydrogenated products of ring-opening metathesis polymer used in the resist composition of the invention preferably have a polydispersity index Mw/Mn in a relatively narrow range of 1.0 to 2.0, wherein Mw is a weight average molecular weight and Mn is a number average molecular weight. Outside the range, a higher polydispersity index suggests a less uniformity of the polymer, leading to a reduction of imaging resolution and sometimes a lowering of etch resistance.

For the preparation of the hydrogenated products of ring-opening metathesis polymer used in the resist composition of the invention, one typical method involves polymerizing monomers giving the respective recurring units in the presence of a ring-opening metathesis catalyst, and hydrogenating in the presence of a hydrogenation catalyst, as disclosed, for example, in Japanese Patent Application No. 2001-113351. The invention is not limited to this method.

In combination with the hydrogenated product of ring-opening metathesis polymer, a poly(meth)acrylic acid derivative is used in the resist composition of the invention. Polymers comprising recurring units of the following general formula (2) are typical of the poly(meth)acrylic acid derivative although the invention is not limited thereto.

Herein, $R^{14}$, $R^{16}$ and $R^{18}$ each are independently hydrogen or methyl. $R^{15}$ is an acid labile group. $R^{17}$ is hydrogen or a monovalent hydrocarbon group of 1 to 15 carbon atoms containing a carboxyl or hydroxyl group. $R^{19}$ is a monovalent hydrocarbon group of 2 to 15 carbon atoms containing at least one partial structure selected from among ether, aldehyde, ketone, ester, carbonate, acid anhydride, amide and imide. $Y^1$ is a group of atoms forming a 5- or 6-membered ring with the two carbon atoms to which it is attached, the ring containing at least one partial structure selected from among ester, carbonate, acid anhydride, amide and imide. $Y^2$ is a group of atoms forming a 5- or 6-membered ring with the carbon atom to which it is attached, the ring containing at least one partial structure selected from among ester, carbonate, acid anhydride, amide and imide. The letters d, e, f, g and h representative of compositional ratios of the corresponding recurring units are such numbers that d is from more than 0 to less than 1, each of e, f, g and h is from 0 to less than 1, satisfying d+e+f+g+h=1. The recurring units introduced in the respective compositional ratios d, e, f, g and h each may be of one or more types.

More particularly, $R^{14}$, $R^{16}$ and $R^{18}$ each are independently hydrogen or methyl. $R^{15}$ is an acid labile group as exemplified above for $R^4$. $R^{17}$ is hydrogen or a monovalent hydrocarbon group of 1 to 15 carbon atoms containing a carboxyl or hydroxyl group, for example, hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, and hydroxyadamantyl.

$R^{19}$ is a monovalent hydrocarbon group of 2 to 15 carbon atoms containing at least one partial structure selected from among ether, aldehyde, ketone, ester, carbonate, acid anhydride, amide and imide, for example, such as methoxymethyl, 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

$Y^1$ is a group of atoms forming a 5- or 6-membered ring with the two carbon atoms to which it is attached, which ring contains at least one partial structure selected from among ester, carbonate, acid anhydride, amide and imide, for example, such as 1-oxo-2-oxapropane-1,3-diyl, 1-oxo-2-oxabutane-1,4-diyl, 2-oxo-1,3-dioxapropane-1,3-diyl, 1,3-dioxo-2-oxapropane-1,3-diyl, 1-oxo-2-azapropane-1,3-diyl, 1-oxo-2-methyl-2-azapropane-1,3-diyl, 1-oxo-2-azabutane-1,4-diyl, 1,3-dioxo-2-azapropane-1,3-diyl, and 1,3-dioxo-2-methyl-2-azapropane-1,3-diyl.

$Y^2$ is a group of atoms forming a 5- or 6-membered ring with the carbon atom to which it is attached, which ring contains at least one partial structure selected from among ester, carbonate, acid anhydride, amide and imide, for example, such as 1-oxo-2-oxabutane-1,4-diyl, 1-oxo-2- oxapentane-1,5-diyl, 1-oxo-2-azabutane-1,4-diyl, 1-oxo-2-methyl-2-azabutane-1,4-diyl, 1-oxo-2-azapentane-1,5-diyl, and 1-oxo-2-methyl-2-azapentane-1,5-diyl.

The letters d, e, f, g and h representative of compositional ratios of the corresponding recurring units are such numbers that d is from more than 0 to less than 1, each of e, f, g and h is from 0 to less than 1, satisfying d+e+f+g+h=1. The preferred ranges of d, e, f, g and h are: $0.1 \leq d \leq 0.9$, $0 \leq e \leq 0.8$, $0 \leq f \leq 0.8$, $0 \leq g \leq 0.8$, and $0 \leq h \leq 0.8$, more preferably $0.2 \leq d \leq 0.8$, $0 \leq e \leq 0.7$, $0 \leq f \leq 0.7$, $0 \leq g \leq 0.7$, and $0 \leq h \leq 0.7$, and most preferably $0.3 \leq d \leq 0.7$, $0 \leq e \leq 0.6$, $0 \leq f \leq 0.6$, $0 \leq g \leq 0.6$, and $0 \leq h \leq 0.6$.

The recurring units introduced in the respective compositional ratios d, e, f, g and h each may be of one or more types. As the compositional ratio of the respective recurring units changes, various properties including developer affinity, substrate adhesion and etch resistance change as well. Then a proper choice of d, e, f, g and h values allows for fine adjustment of the resist composition's performance.

The poly(meth)acrylic acid derivatives used in the resist composition of the invention preferably have a weight average molecular weight (Mw) of about 1,000 to 500,000, and preferably about 3,000 to 100,000, as measured by GPC using a polystyrene standard. Outside the range, the etch resistance may become extremely low and the resolution may become low because a substantial difference in rate of dissolution before and after exposure is lost.

The poly(meth)acrylic acid derivatives used in the resist composition of the invention preferably have a polydispersity index Mw/Mn in a relatively narrow range of 1.0 to 3.0. Outside the range, a higher polydispersity index suggests a less uniformity of the polymer, leading to a reduction of imaging resolution and sometimes a lowering of etch resistance.

For the preparation of the poly(meth)acrylic acid derivatives used in the resist composition of the invention, the method used may be, for example, that of JP-A 2000-159758, but not limited thereto.

In the resist composition of the invention, the hydrogenated product of ring-opening metathesis polymer and the poly(meth)acrylic acid derivative are preferably mixed in a weight ratio of from 90:10 to 10:90 and more preferably from 80:20 to 20:80. Outside the range, too lower a proportion of the hydrogenated product of ring-opening metathesis polymer may lead to lower etch resistance, whereas too lower a proportion of the poly(meth)acrylic acid derivative may fail to achieve resolution enhancing effects.

Resist Composition

The resist composition of the invention further includes a photoacid generator, an organic solvent, and other optional components.

Photoacid Generator

The photoacid generator is a compound capable of generating an acid upon exposure to high energy radiation or electron beams and includes the following:

(i) onium salts of the formula (P1a-1), (P1a-2) or (P1b),
(ii) diazomethane derivatives of the formula (P2),
(iii) glyoxime derivatives of the formula (P3),
(iv) bissulfone derivatives of the formula (P4),
(v) sulfonic acid esters of N-hydroxyimide compounds of the formula (P5),
(vi) β-ketosulfonic acid derivatives,
(vii) disulfone derivatives,
(viii) nitrobenzylsulfonate derivatives, and
(ix) sulfonate derivatives.

These photoacid generators are described in detail.
(i) Onium Salts of Formula (P1a-1), (P1a-2) or (P1b):

Herein, $R^{101a}$, $R^{101b}$, and $R^{101c}$ independently represent straight, branched or cyclic alkyl, alkenyl, oxoalkyl or oxoalkenyl groups of 1 to 12 carbon atoms, aryl groups of 6 to 20 carbon atoms, or aralkyl or aryloxoalkyl groups of 7 to 12 carbon atoms, wherein some or all of the hydrogen atoms may be replaced by alkoxy or other groups. Also, $R^{101b}$ and $R^{101c}$, taken together, may form a ring. $R^{101b}$ and $R^{101c}$ each are alkylene groups of 1 to 6 carbon atoms when they form a ring. $K^-$ is a non-nucleophilic counter ion.

$R^{101a}$, $R^{101b}$, and $R^{101c}$ may be the same or different and are illustrated below. Exemplary alkyl groups include methyl, ethyl, propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl, cyclohexylmethyl, norbornyl, and adamantyl. Exemplary alkenyl groups include vinyl, allyl, propenyl, butenyl, hexenyl, and cyclohexenyl. Exemplary oxoalkyl groups include 2-oxocyclopentyl and 2-oxocyclohexyl as well as 2-oxopropyl, 2-cyclopentyl-2-oxoethyl, 2-cyclohexyl-2-oxoethyl, and 2-(4-methylcyclohexyl)-2-oxoethyl. Exemplary aryl groups include phenyl and naphthyl; alkoxyphenyl groups such as p-methoxyphenyl, m-methoxyphenyl, o-methoxyphenyl, ethoxyphenyl, p-tert-butoxyphenyl, and m-tert-butoxyphenyl; alkylphenyl groups such as 2-methylphenyl, 3-methylphenyl, 4-methylphenyl, ethylphenyl, 4-tert-butylphenyl, 4-butylphenyl, and dimethylphenyl; alkylnaphthyl groups such as methylnaphthyl and ethylnaphthyl; alkoxynaphthyl groups such as methoxynaphthyl and ethoxynaphthyl; dialkylnaphthyl groups such as dimethylnaphthyl and diethylnaphthyl; and dialkoxynaphthyl groups such as dimethoxynaphthyl and diethoxynaphthyl. Exemplary aralkyl groups include benzyl, phenylethyl, and phenethyl. Exemplary aryloxoalkyl groups are 2-aryl-2-oxoethyl groups such as 2-phenyl-2-oxoethyl, 2-(1-naphthyl)-2-oxoethyl, and 2-(2-naphthyl)-2-oxoethyl. Examples of the non-nucleophilic counter ion represented by $K^-$ include halide ions such as chloride and bromide ions, fluoroalkylsulfonate ions such as triflate, 1,1,1-trifluoroethanesulfonate, and nonafluorobutanesulfonate, arylsulfonate ions such as tosylate, benzenesulfonate, 4-fluorobenzenesulfonate, and 1,2,3,4,5-pentafluorobenzenesulfonate, and alkylsulfonate ions such as mesylate and butanesulfonate.

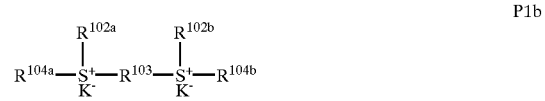

Herein, $R^{102a}$ and $R^{102b}$ independently represent straight, branched or cyclic alkyl groups of 1 to 8 carbon atoms. $R^{103}$ represents a straight, branched or cyclic alkylene groups of 1 to 10 carbon atoms. $R^{104a}$ and $R^{104b}$ independently represent 2-oxoalkyl groups of 3 to 7 carbon atoms. $K^-$ is a non-nucleophilic counter ion.

Illustrative of the groups represented by $R^{102a}$ and $R^{102b}$ are methyl, ethyl, propyl, isopropyl, n-butyl, sec-butyl, tert-butyl, pentyl, hexyl, heptyl, octyl, cyclopentyl, cyclohexyl, cyclopropylmethyl, 4-methylcyclohexyl, and cyclohexylmethyl. Illustrative of the groups represented by $R^{103}$ are methylene, ethylene, propylene, butylene, pentylene, hexylene, heptylene, octylene, nonylene, 1,4-cyclohexylene, 1,2-cyclohexylene, 1,3-cyclopentylene, 1,4-cyclooctylene, and 1,4-cyclohexanedimethylene. Illustrative of the groups represented by $R^{104a}$ and $R^{104b}$ are 2-oxopropyl, 2-oxocyclopentyl, 2-oxocyclohexyl, and 2-oxocycloheptyl. Illustrative examples of the counter ion represented by $K^-$ are the same as exemplified for formulae (P1a-1) and (P1a-2).

(ii) Diazomethane Derivatives of Formula (P2)

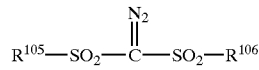

P2

Herein, $R^{105}$ and $R^{106}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms.

Of the groups represented by $R^{105}$ and $R^{106}$, exemplary alkyl groups include methyl, ethyl, propyl, isopropyl, n-butyl, sec-butyl, tert-butyl, pentyl, hexyl, heptyl, octyl, amyl, cyclopentyl, cyclohexyl, cycloheptyl, norbornyl, and adamantyl. Exemplary halogenated alkyl groups include trifluoromethyl, 1,1,1-trifluoroethyl, 1,1,1-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

(iii) Glyoxime Derivatives of Formula (P3)

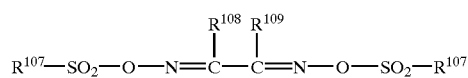

P3

Herein, $R^{107}$, $R^{108}$, and $R^{109}$ independently represent straight, branched or cyclic alkyl or halogenated alkyl groups of 1 to 12 carbon atoms, aryl or halogenated aryl groups of 6 to 20 carbon atoms, or aralkyl groups of 7 to 12 carbon atoms. Also, $R^{108}$ and $R^{109}$, taken together, may form a ring. $R^{108}$ and $R^{109}$ each are straight or branched alkylene groups of 1 to 6 carbon atoms when they form a ring.

Illustrative examples of the alkyl, halogenated alkyl, aryl, halogenated aryl, and aralkyl groups represented by $R^{107}$, $R^{108}$, and $R^{109}$ are the same as exemplified for $R^{105}$ and $R^{106}$. Examples of the alkylene groups represented by $R^{108}$ and $R^{109}$ include methylene, ethylene, propylene, butylene, and hexylene.

(iv) Bissulfone Derivatives of Formula (P4)

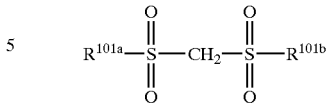

P4

Herein, $R^{101a}$ and $R^{101b}$ are as defined above.

(v) Sulfonic Acid Esters of N-Hydroxyimide Compounds of Formula (P5)

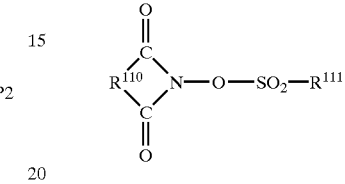

P5

Herein, $R^{110}$ is an arylene group of 6 to 10 carbon atoms, alkylene group of 1 to 6 carbon atoms, or alkenylene group of 2 to 6 carbon atoms wherein some or all of the hydrogen atoms may be replaced by straight or branched alkyl or alkoxy groups of 1 to 4 carbon atoms, nitro, acetyl, or phenyl groups. $R^{111}$ is a straight, branched or cyclic alkyl group of 1 to 8 carbon atoms, alkenyl, alkoxyalkyl, phenyl or naphthyl group wherein some or all of the hydrogen atoms may be replaced by alkyl or alkoxy groups of 1 to 4 carbon atoms, phenyl groups (which may have substituted thereon an alkyl or alkoxy of 1 to 4 carbon atoms, nitro, or acetyl group), hetero-aromatic groups of 3 to 5 carbon atoms, or chlorine or fluorine atoms.

Of the groups represented by $R^{110}$, exemplary arylene groups include 1,2-phenylene and 1,8-naphthylene; exemplary alkylene groups include methylene, ethylene, trimethylene, tetramethylene, phenylethylene, and norbornane-2,3-diyl; and exemplary alkenylene groups include 1,2-vinylene, 1-phenyl-1,2-vinylene, and 5-norbornene-2,3-diyl. Of the groups represented by $R^{111}$, exemplary alkyl groups are as exemplified for $R^{101a}$ to $R^{101c}$; exemplary alkenyl groups include vinyl, 1-propenyl, allyl, 1-butenyl, 3-butenyl, isoprenyl, 1-pentenyl, 3-pentenyl, 4-pentenyl, dimethylallyl, 1-hexenyl, 3-hexenyl, 5-hexenyl, 1-heptenyl, 3-heptenyl, 6-heptenyl, and 7-octenyl; and exemplary alkoxyalkyl groups include methoxymethyl, ethoxymethyl, propoxymethyl, butoxymethyl, pentyloxymethyl, hexyloxymethyl, heptyloxymethyl, methoxyethyl, ethoxyethyl, propoxyethyl, butoxyethyl, pentyloxyethyl, hexyloxyethyl, methoxypropyl, ethoxypropyl, propoxypropyl, butoxypropyl, methoxybutyl, ethoxybutyl, propoxybutyl, methoxypentyl, ethoxypentyl, methoxyhexyl, and methoxyheptyl.

Of the substituents on these groups, the alkyl groups of 1 to 4 carbon atoms include methyl, ethyl, propyl, isopropyl, n-butyl, isobutyl and tert-butyl; the alkoxy groups of 1 to 4 carbon atoms include methoxy, ethoxy, propoxy, isopropoxy, n-butoxy, isobutoxy, and tert-butoxy; the phenyl groups which may have substituted thereon an alkyl or alkoxy of 1 to 4 carbon atoms, nitro, or acetyl group include phenyl, tolyl, p-tert-butoxyphenyl, p-acetylphenyl and p-nitrophenyl; the hetero-aromatic groups of 3 to 5 carbon atoms include pyridyl and furyl.

Illustrative examples of the photoacid generator include:
onium salts such as diphenyliodonium trifluoromethanesulfonate, (p-tert-butoxyphenyl)

phenyliodonium trifluoromethanesulfonate, diphenyliodonium p-toluenesulfonate, (p-tert-butoxyphenyl) phenyliodonium p-toluenesulfonate, triphenylsulfonium trifluoromethanesulfonate, (p-tert-butoxyphenyl) diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris (p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl) sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate;

diazomethane derivatives such as bis(benzenesulfonyl) diazomethane, bis(p-toluenesulfonyl)diazomethane, bis (xylenesulfonyl)diazomethane, bis(cyclohexylsulfonyl) diazomethane, bis(cyclopentylsulfonyl)diazomethane, bis (n-butylsulfonyl)diazomethane, bis(isobutylsulfonyl) diazomethane, bis(sec-butylsulfonyl)diazomethane, bis(n-propylsulfonyl)diazomethane, bis(isopropylsulfonyl) diazomethane, bis(tert-butylsulfonyl)diazomethane, bis(n-amylsulfonyl)diazomethane, bis(isoamylsulfonyl) diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane;

glyoxime derivatives such as bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime;

bissulfone derivatives such as bisnaphthylsulfonylmethane, bistrifluoromethylsulfonylmethane, bismethylsulfonylmethane, bisethylsulfonylmethane, bispropylsulfonylmethane, bisisopropylsulfonylmethane, bis-p-toluenesulfonylmethane, and bisbenzenesulfonylmethane;

β-ketosulfone derivatives such as 2-cyclohexylcarbonyl-2-(p-toluenesulfonyl)propane and 2-isopropylcarbonyl-2-(p-toluenesulfonyl)propane;

disulfone derivatives such as diphenyl disulfone and dicyclohexyl disulfone;

nitrobenzyl sulfonate derivatives such as 2,6-dinitrobenzyl p-toluenesulfonate and 2,4-dinitrobenzyl p-toluenesulfonate;

sulfonic acid ester derivatives such as 1,2,3-tris (methanesulfonyloxy)benzene, 1,2,3-tris (trifluoromethanesulfonyloxy)benzene, and 1,2,3-tris(p-toluenesulfonyloxy)benzene; and sulfonic acid esters of N-hydroxyimides such as N-hydroxysuccinimide methanesulfonate, N-hydroxysuccinimide trifluoromethanesulfonate, N-hydroxysuccinimide ethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide 1-octanesulfonate, N-hydroxysuccinimide p-toluenesulfonate, N-hydroxysuccinimide p-methoxybenzenesulfonate, N-hydroxysuccinimide 2-chloroethanesulfonate, N-hydroxysuccinimide benzenesulfonate, N-hydroxysuccinimide 2,4,6-trimethylbenzenesulfonate, N-hydroxysuccinimide 1-naphthalenesulfonate, N-hydroxysuccinimide 2-naphthalenesulfonate, N-hydroxy-2-phenylsuccinimide methanesulfonate, N-hydroxymaleimide methanesulfonate, N-hydroxymaleimide ethanesulfonate, N-hydroxy-2-phenylmaleimide methanesulfonate, N-hydroxyglutarimide methanesulfonate, N-hydroxyglutarimide benzenesulfonate, N-hydroxyphthalimide methanesulfonate, N-hydroxyphthalimide benzenesulfonate, N-hydroxyphthalimide trifluoromethanesulfonate, N-hydroxyphthalimide p-toluenesulfonate, N-hydroxynaphthalimide methanesulfonate, N-hydroxynaphthalimide benzenesulfonate, N-hydroxy-5-norbornene-2,3-dicarboxyimide methanesulfonate, N-hydroxy-5-norbornene-2,3-dicarboxyimide trifluoromethanesulfonate, and N-hydroxy-5-norbornene-2,3-dicarboxyimide p-toluenesulfonate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl) sulfonium trifluoromethanesulfonate, triphenylsulfonium p-toluenesulfonate, (p-tert-butoxyphenyl) diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl) diazomethane, bis(p-toluenesulfonyl)diazomethane, bis (cyclohexylsulfonyl)diazomethane, bis(n-butylsulfonyl) diazomethane, bis(isobutylsulfonyl)diazomethane, bis(sec-butylsulfonyl)diazomethane, bis(n-propylsulfonyl) diazomethane, bis(isopropylsulfonyl)diazomethane, and bis (tert-butylsulfonyl)diazomethane; glyoxime derivatives such as bis-O-(p-toluenesulfonyl)-α-dimethylglyoxime and bis-O-(n-butanesulfonyl)-α-dimethylglyoxime; bissulfone derivatives such as bisnaphthylsulfonylmethane; and sulfonic acid esters of N-ydroxyimide compounds such as N-hydroxysuccinimide methanesulfonate, N-hydroxysuccinimide trifluoromethanesulfonate, N-hydroxysuccinimide 1-propanesulfonate, N-hydroxysuccinimide 2-propanesulfonate, N-hydroxysuccinimide 1-pentanesulfonate, N-hydroxysuccinimide p-toluenesulfonate, N-hydroxynaphthalimide methanesulfonate, and N-hydroxynaphthalimide benzenesulfonate.

These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of 0.1 to 15 parts, and especially 0.5 to 8 parts by weight, per 100 parts by weight of the base resin (all parts are by weight, hereinafter). Less than 0.1 part of the photoacid generator would provide a poor sensitivity whereas more than 15 parts of the photoacid generator would adversely affect transparency and resolution.

Organic Solvent

The organic solvent used herein may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate. These solvents may be used alone or in combinations of two or more thereof. Of the above organic solvents, it is recommended to use diethylene glycol dimethyl ether and 1-ethoxy-2-propanol because the photoacid generator is most soluble therein, propylene glycol monomethyl ether acetate because it is a safe solvent, or a mixture thereof.

An appropriate amount of the organic solvent used is about 200 to 1,000 parts, especially about 400 to 800 parts by weight per 100 parts by weight of the base resin.

Other Polymer

To the resist composition of the invention, another polymer other than the hydrogenated product of ring-opening metathesis polymer and the poly(meth)acrylic acid derivative according to the invention may also be added. The other polymers that can be added to the resist composition are, for example, those polymers comprising units of the following formula (R1) and/or (R2) and having a weight average molecular weight of about 1,000 to about 500,000, especially about 5,000 to about 100,000 although the other polymers are not limited thereto.

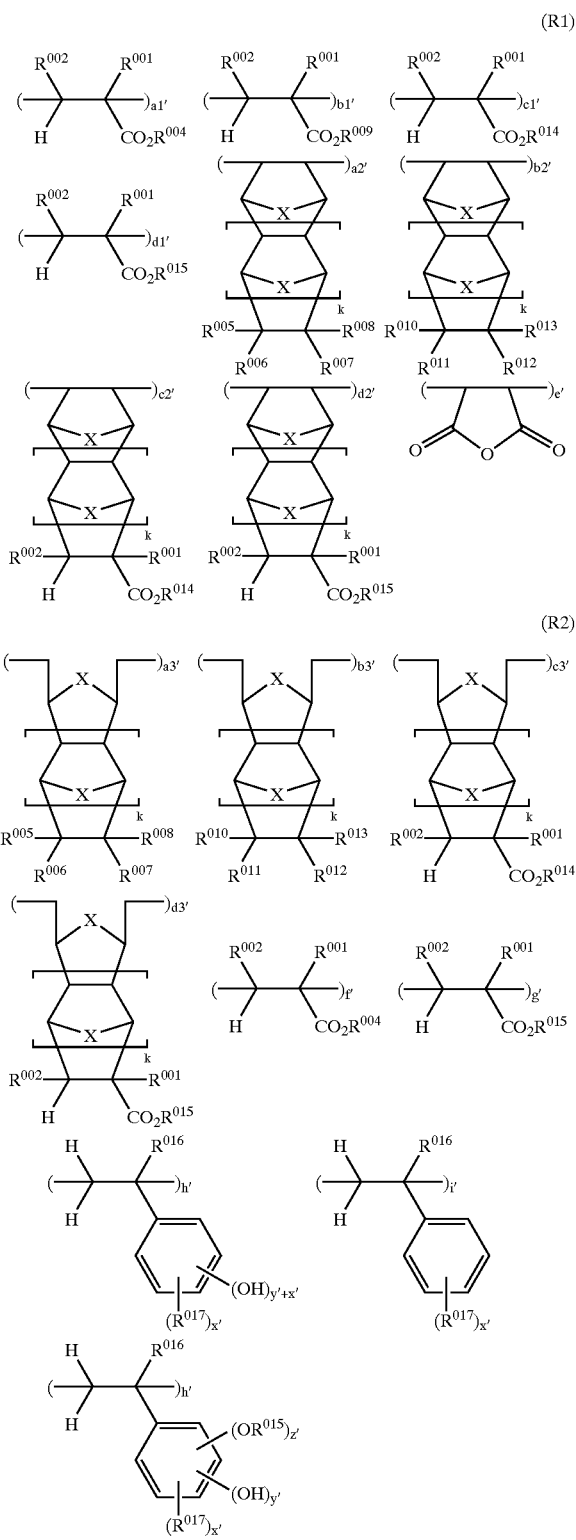

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic alkyl group of 1 to 15 carbon atoms. $R^{004}$ is hydrogen or a monovalent hydrocarbon group of 1 to 15 carbon atoms having a carboxyl or hydroxyl group. At least one of $R^{005}$ to $R^{008}$ represents a monovalent hydrocarbon group of 1 to 15 carbon atoms having a carboxyl or hydroxyl group while the remaining R's independently represent hydrogen or a straight, branched or cyclic alkyl group of 1 to 15 carbon atoms. Alternatively, $R^{005}$ to $R^{008}$, taken together, may form a ring, and in that event, at least one of $R^{005}$ to $R^{008}$ is a divalent hydrocarbon group of 1 to 15 carbon atoms having a carboxyl or hydroxyl group, while the remaining R's are independently single bonds or straight, branched or cyclic alkylene groups of 1 to 15 carbon atoms. $R^{009}$ is a monovalent hydrocarbon group of 2 to 15 carbon atoms containing at least one partial structure selected from among ether, aldehyde, ketone, ester, carbonate, acid anhydride, amide and imide. At least one of $R^{010}$ to $R^{013}$ is a monovalent hydrocarbon group of 2 to 15 carbon atoms containing at least one partial structure selected from among ether, aldehyde, ketone, ester, carbonate, acid anhydride, amide and imide, while the remaining R's are independently hydrogen or straight, branched or cyclic alkyl groups of 1 to 15 carbon atoms. $R^{010}$ to $R^{013}$, taken together, may form a ring, and in that event, at least one of $R^{010}$ to $R^{013}$ is a divalent hydrocarbon group of 1 to 15 carbon atoms containing at least one partial structure selected from among ether, aldehyde, ketone, ester, carbonate, acid anhydride, amide and imide, while the remaining R's are independently single bonds or straight, branched or cyclic alkylene groups of 1 to 15 carbon atoms. $R^{014}$ is a polycyclic hydrocarbon group having 7 to 15 carbon atoms or an alkyl group containing a polycyclic hydrocarbon group. $R^{015}$ is an acid labile group. $R^{016}$ is hydrogen or methyl. $R^{017}$ is a straight, branched or cyclic alkyl group of 1 to 8 carbon atoms. X is $CH_2$ or an oxygen atom. Letter k' is equal to 0 or 1; a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', and j' are numbers from 0 to less than 1, satisfying f'+g'+h'+i'+j'=1; x', y' and z' each are an integer of 0 to 3, satisfying $1 \leq x'+y'+z' \leq 5$ and $1 \leq y'+z' \leq 3$.

Exemplary groups of these R's are as exemplified above.

The other polymer is added for the purpose of fine adjustment of resist performance. It is recommended to add a small amount of the other polymer in order that the advantages of the invention be not compromised. Specifically, the inventive base resin (the hydrogenated product of ring-opening metathesis polymer plus the poly (meth)acrylic acid derivative) and the other polymer are blended in a weight ratio from 100:0 to 70:30, more preferably from 100:0 to 80:20. If the other polymer is blended too much beyond this range, the resist composition would lose some of the desired properties such as by giving rise to phase separation during film formation and partial film stripping during pattern formation.

The other polymer is not limited to one type and a mixture of two or more other polymers may be added. The use of plural polymers allows for adjustment of resist properties.

Dissolution Regulator

To the resist composition, a dissolution regulator may be added. The dissolution regulator is a compound having on the molecule at least two phenolic hydroxyl groups, in which an average of from 0 to 100 mol % of all the hydrogen atoms on the phenolic hydroxyl groups are replaced with acid labile groups or a compound having on the molecule at least one carboxyl group, in which an average of 50 to 100 mol % of all the hydrogen atoms on the carboxyl groups are replaced with acid labile groups, both the compounds having an average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having at least one carboxyl group include those of formulas (D1) to (D14) below.

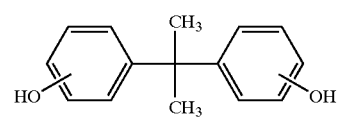

D1

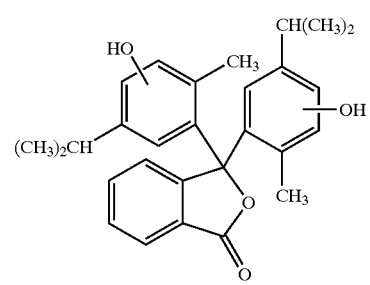

D2

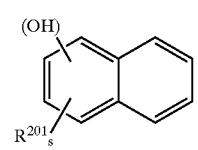

D3

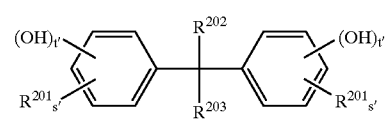

D4

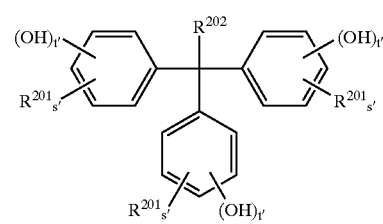

D5

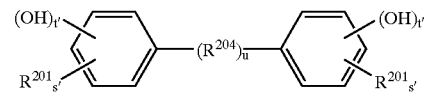

D6

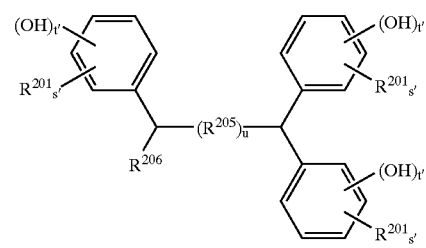

D7

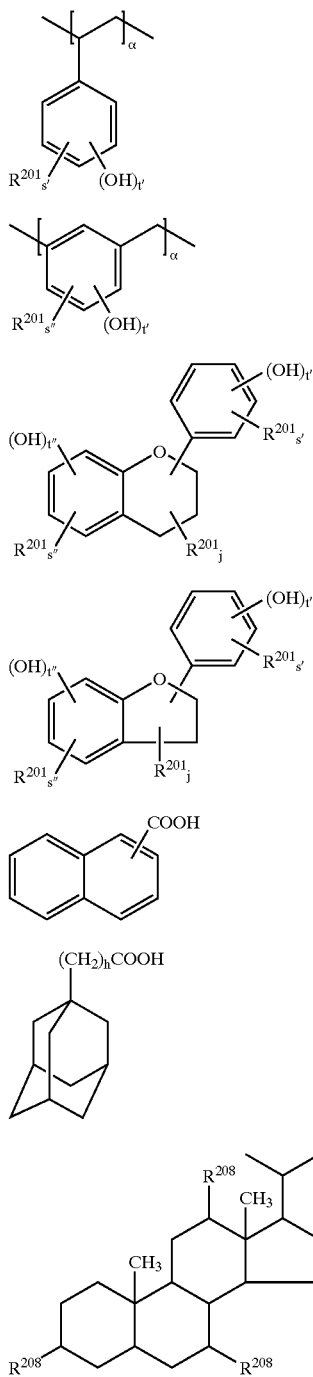

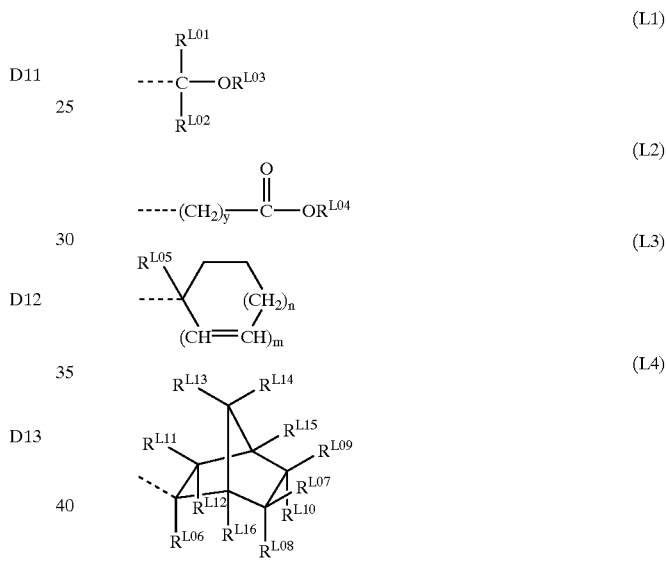

In these formulas, $R^{201}$ and $R^{202}$ are each hydrogen or a straight or branched alkyl or alkenyl of 1 to 8 carbon atoms; $R^{203}$ is hydrogen, a straight or branched alkyl or alkenyl of 1 to 8 carbon atoms, or —$(R^{207})_h$—COOH; $R^{204}$ is —$(CH_2)_i$— (where i=2 to 10), an arylene of 6 to 10 carbon atoms, carbonyl, sulfonyl, an oxygen atom, or a sulfur atom; $R^{205}$ is an alkylene of 1 to 10 carbon atoms, an arylene of 6 to 10 carbon atoms, carbonyl, sulfonyl, an oxygen atom, or a sulfur atom; $R^{206}$ is hydrogen, a straight or branched alkyl or alkenyl of 1 to 8 carbon atoms, or a hydroxyl-substituted phenyl or naphthyl; $R^{207}$ is a straight or branched alkylene of 1 to 10 carbon atoms; $R^{208}$ is hydrogen or hydroxyl; the letter j is an integer from 0 to 5; u and h are each 0 or 1; s, t, s', t', s", and t" are each numbers which satisfy s+t=8, s'+t'=5, and s"+t"=4, and are such that each phenyl skeleton has at least one hydroxyl group; and α is a number such that the compounds of formula (D8) or (D9) have a molecular weight of from 100 to 1,000.

In the above formulas, suitable examples of $R^{201}$ and $R^{202}$ include hydrogen, methyl, ethyl, butyl, propyl, ethynyl, and cyclohexyl; suitable examples of $R^{203}$ include the same groups as for $R^{201}$ and $R^{202}$, as well as —COOH and —$CH_2COOH$; suitable examples of $R^{204}$ include ethylene, phenylene, carbonyl, sulfonyl, oxygen, and sulfur; suitable examples of $R^{205}$ include methylene as well as the same groups as for $R^{204}$; and suitable examples of $R^{206}$ include hydrogen, methyl, ethyl, butyl, propyl, ethynyl, cyclohexyl, and hydroxyl-substituted phenyl or naphthyl.

Exemplary acid labile groups on the dissolution regulator include groups of the following general formulae (L1) to (L4), tertiary alkyl groups of 4 to 20 carbon atoms, trialkylsilyl groups in which each of the alkyls has 1 to 6 carbon atoms, and oxoalkyl groups of 4 to 20 carbon atoms.

In these formulas, $R^{L01}$ and $R^{L02}$ are each hydrogen or a straight, branched or cyclic alkyl having 1 to 18 carbon atoms; and $R^{L03}$ is a monovalent hydrocarbon group of 1 to 18 carbon atoms which may contain a heteroatom (e.g., oxygen). A pair of $R^{L01}$ and $R^{L02}$, a pair of $R^{L01}$ and $R^{L03}$, or a pair of $R^{L02}$ and $R^{L03}$ may together form a ring, with the proviso that $R^{L01}$, $R^{L02}$, and $R^{L03}$ are each a straight or branched alkylene of 1 to 18 carbon atoms when they form a ring. $R^{L04}$ is a tertiary alkyl group of 4 to 20 carbon atoms, a trialkysilyl group in which each of the alkyls has 1 to 6 carbon atoms, an oxoalkyl group of 4 to 20 carbon atoms, or a group of the formula (L1). $R^{L05}$ is a monovalent hydrocarbon group of 1 to 8 carbon atoms which may contain a hetero atom or a substituted or unsubstituted aryl group of 6 to 20 carbon atoms. $R^{L06}$ is a monovalent hydrocarbon groups of 1 to 8 carbon atoms which may contain a hetero atom or a substituted or unsubstituted aryl group of 6 to 20 carbon atoms. $R^{L07}$ to $R^{L16}$ independently represent hydrogen or monovalent hydrocarbon groups of 1 to 15 carbon atoms which may contain a hetero atom. Alternatively, $R^{L07}$ to $R^{L16}$, taken together, may form a ring. Each of $R^{L07}$ to $R^{L16}$ represents a divalent $C_1$–$C_{15}$ hydrocarbon group which may contain a hetero atom, when they form a ring. Two of $R^{L07}$ to $R^{L16}$ which are attached to adjoining carbon atoms may bond together directly to form a double bond. Letter y is an integer of 0 to 6. Letter m is equal to 0 or 1, n is equal to 0, 1, 2 or 3, and 2m+n is equal to 2 or 3. Illustrative examples of these groups are as previously exemplified.

The dissolution regulator may be formulated in an amount of 0 to 50 parts, preferably 0 to 40 parts, and more preferably 0 to 30 parts, per 100 parts of the base resin, and may be used singly or as a mixture of two or more thereof. The use of more than 50 parts would lead to slimming of the patterned film, and thus a decline in resolution.

The dissolution regulator can be synthesized by introducing acid labile groups into a compound having phenolic hydroxyl or carboxyl groups in accordance with an organic chemical formulation.

Basic Compound

In the resist composition of the invention, a basic compound may be blended. A suitable basic compound used herein is a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile.

Examples of basic compounds include primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include ammonia, methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethyletlylamine, methylethylpropylarnine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridone, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable sulfonyl group-bearing nitrogenous compounds include 3-pyridinesulfonic acid and pyridinium p-toluenesulfonate. Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N- dimethylacetamide, propionamide, and benzamide. Suitable imide derivatives include phthalimide, succinimide, and maleimide.

In addition, basic compounds of the following general formula (B1) may also be included alone or in admixture.

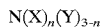

In the formula, n is equal to 1, 2 or 3; Y is independently hydrogen or a straight, branched or cyclic alkyl group of 1 to 20 carbon atoms which may contain a hydroxyl group or ether; and X is independently selected from groups of the following general formulas (X1) to (X3), and two or three X's may bond together to form a ring.

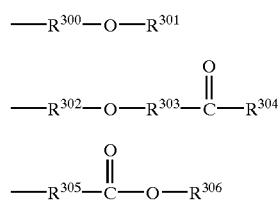

In the formulas, $R^{300}$, $R^{302}$ and $R^{305}$ are independently straight or branched alkylene groups of 1 to 4 carbon atoms; $R^{301}$, $R^{304}$ and $R^{306}$ are independently hydrogen, straight, branched or cyclic alkyl groups of 1 to 20 carbon atoms, which may contain at least one hydroxyl group, ether, ester or lactone ring; $R^{303}$ is a single bond or a straight or branched alkylene group of 1 to 4 carbon atoms.

Illustrative examples of the basic compounds of formula (B1) include tris(2-methoxymethoxyethyl)amine, tris{2-(methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclo-octadecane, 1-aza-12-crown-4, 1-aza-15-crown-5, 1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]ethylamine, N,N-bis(2-acetoxyethyl)-2-[(methoxycarbonyl)methoxycarbonyl]ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)ethylamine, N,N-bis(2-acetoxyethyl)-2-(tetrahydrofurfuryloxycarbonyl)ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)ethylamine, N,N-bis(2-formyloxyethyl)-2-(2-formyloxyethoxycarbonyl)ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B2).

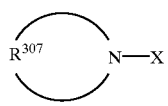

Herein X is as defined above, and $R^{307}$ is a straight or branched alkylene group of 2 to 20 carbon atoms which may contain one or more carbonyl groups, ether structures, ester structures or sulfide structures.

Illustrative examples of the cyclic structure-bearing basic compounds having formula (B2) include 1-[2-(methoxymethoxy)ethyl]pyrrolidine, 1-[2-(methoxymethoxy)ethyl]piperidine, 4-[2-(methoxymethoxy)ethyl]-morpholine, 1-[2-[(2-methoxyethoxy)methoxy]ethyl] pyrrolidine, 1-[2-[(2-methoxyethoxy)methoxy]ethyl] piperidine, 4-[2-[(2-methoxyethoxy)methoxy]ethyl] morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl] morpholine, 1-[2-(t-butoxycarbonyloxy)ethyl]-piperidine, 4-[2-(2-methoxyethoxycarbonyloxy)ethyl]-morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl) methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B3) to (B6) may be blended.

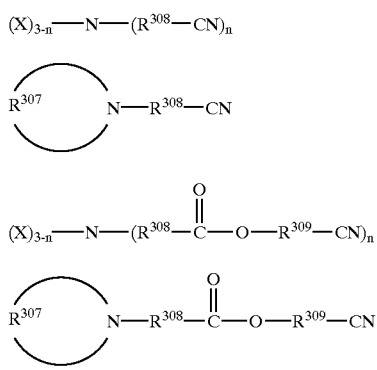

B3
B4
B5
B6

Herein, X, $R^{307}$ and n are as defined above, and $R^{308}$ and $R^{309}$ each are independently a straight or branched alkylene group of 1 to 4 carbon atoms.

Illustrative examples of the cyano-bearing basic compounds having formulae (B3) to (B6) include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropionitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl) aminoacetonitrile, N,N-bis(2-formyloxyethyl) aminoacetonitrile, N,N-bis(2-methoxyethyl) aminoacetonitrile, N,N-bis[2-(methoxymethoxy)ethyl] aminoacetonitrile, methyl N-cyanomethyl-N-(2-methoxyethyl)-3-aminopripionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl] aminoacetonitrile, N-cyanomethyl-N-(3-hydroxy-1-propyl) aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis (cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis (2-methoxyethyl)-3-aminopropionate, cyanomethyl N,N-bis [2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 10 parts, and especially 0.01 to 1 part, per part of the photoacid generator. Less than 0.001 part of the basic compound may fail to achieve the desired effects thereof, while the use of more than 10 parts would result in too low a sensitivity and resolution.

Other Components

In the resist composition, a compound bearing a ≡C—COOH group in a molecule may be blended. Exemplary, non-limiting compounds bearing a ≡C—COOH group include one or more compounds selected from Groups I and II below. Including this compound improves the PED stability of the resist and ameliorates edge roughness on nitride film substrates.

Group I:

Compounds in which some or all of the hydrogen atoms on the phenolic hydroxyl groups of the compounds of general formulas (A1) to (A10) below have been replaced with —$R^{401}$—COOH (wherein $R^{401}$ is a straight or branched alkylene of 1 to 10 carbon atoms), and in which the molar ratio C/(C+D) of phenolic hydroxyl groups (C) to ≡C—COOH groups (D) in the molecule is from 0.1 to 1.0.

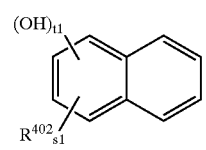

A1

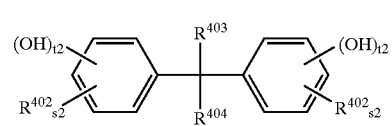

A2

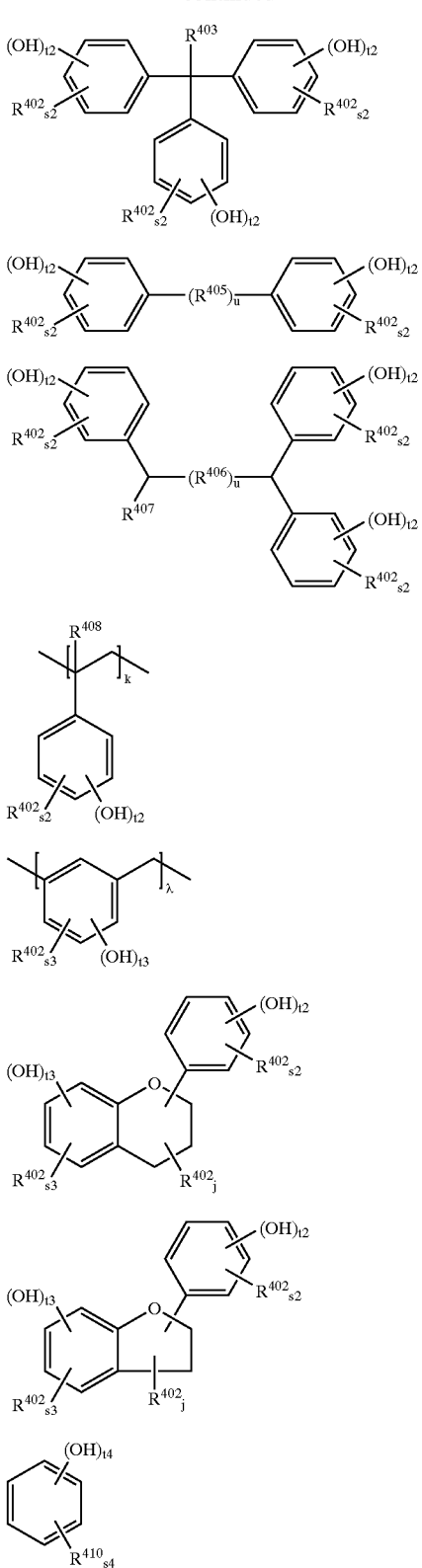

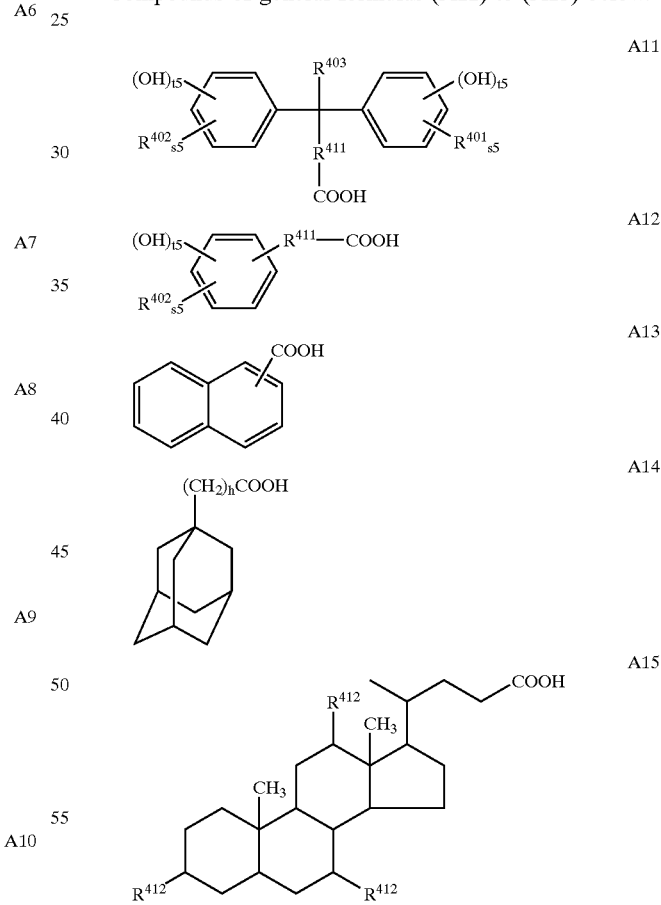

COOH); $R^{405}$ is —$(CH_2)_i$— (wherein i is 2 to 10), an arylene of 6 to 10 carbon atoms, carbonyl, sulfonyl, an oxygen atom, or a sulfur atom; $R^{406}$ is an alkylene of 1 to 10 carbon atoms, an arylene of 6 to 10 carbon atoms, carbonyl, sulfonyl, an oxygen atom, or a sulfur atom; $R^{407}$ is hydrogen, a straight or branched alkyl or alkenyl of 1 to 8 carbon atoms, or a hydroxyl-substituted phenyl or naphthyl; $R^{409}$ is a straight or branched alkylene of 1 to 10 carbon atoms; $R^{410}$ is hydrogen, a straight or branched alkyl or alkenyl of 1 to 8 carbon atoms, or a —$R^{411}$—COOH group; $R^{411}$ is a straight or branched alkylene of 1 to 10 carbon atoms; the letter j is an integer from 0 to 5; u and h are each 0 or 1; s1, t1, s2, t2, s3, t3, s4, and t4 are each numbers which satisfy s1+t1=8, s2+t2=5, s3+t3=4, and s4+t4=6, and are such that each phenyl skeleton has at least one hydroxyl group; κ is a number such that the compound of formula (A6) may have a weight average molecular weight of 1,000 to 5,000; and λ is a number such that the compound of formula (A7) may have a weight average molecular weight of 1,000 to 10,000.

Group II:

Compounds of general formulas (A11) to (A15) below.

In these formulas, $R^{402}$, $R^{403}$, and $R^{411}$ are as defined above; $R^{412}$ is hydrogen or hydroxyl; s5 and t5 are numbers which satisfy s5≧0, t5≧0, and s5+t5=5; and h' is equal to 0 or 1.

Illustrative, non-limiting examples of the compound bearing a ≡C—COOH group include compounds of the general formulas AI-1 to AI-14 and AII-1 to AII-10 below.

In these formulas, $R^{408}$ is hydrogen or methyl; $R^{402}$ and $R^{403}$ are each hydrogen or a straight or branched alkyl or alkenyl of 1 to 8 carbon atoms; $R^{404}$ is hydrogen, a straight or branched alkyl or alkenyl of 1 to 8 carbon atoms, or a —$(R^{409})_h$—COOR' group (R' being hydrogen or —$R^{409}$—

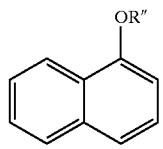
AI-1
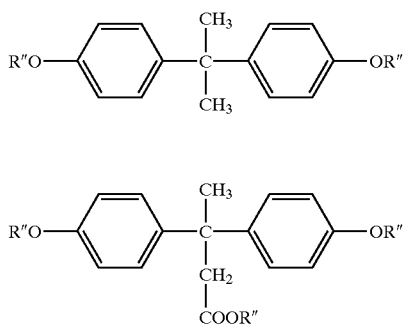
AI-2
AI-3
AI-4
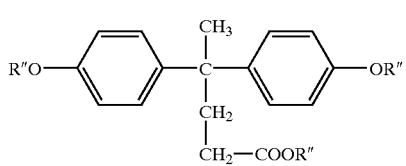
AI-5
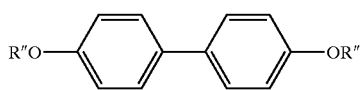
AI-6
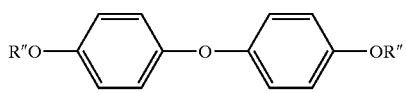
AI-7
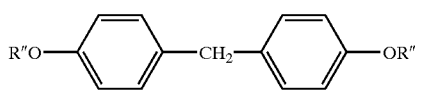
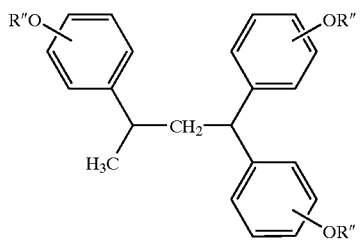
AI-8
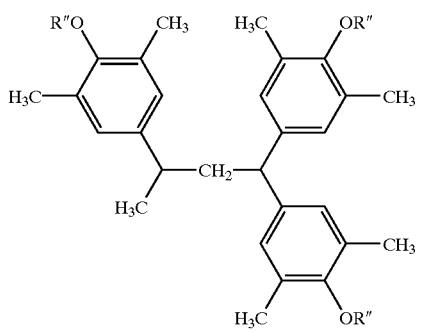
AI-9
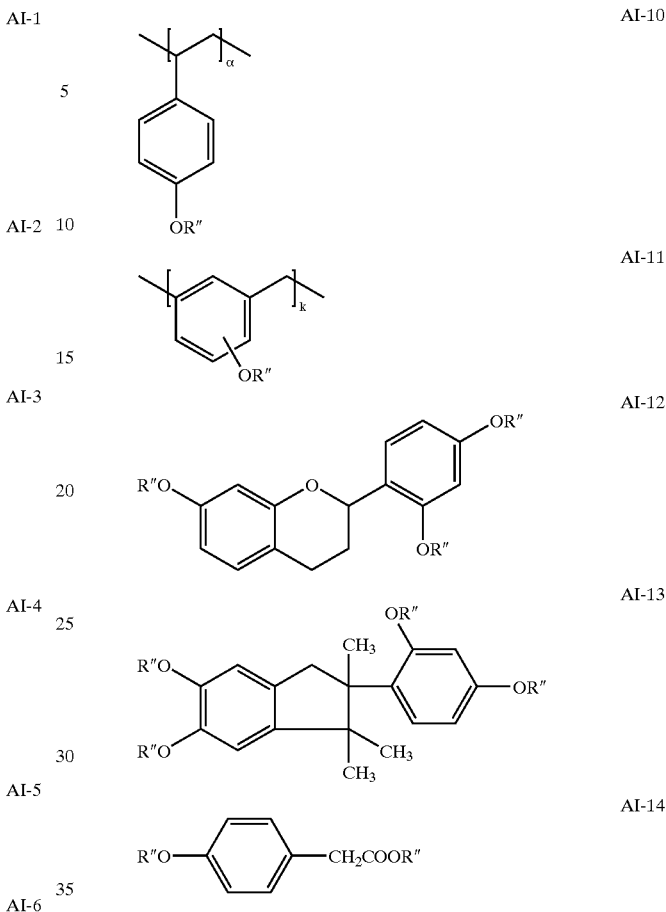
AI-10
AI-11
AI-12
AI-13
AI-14
In the above formulas, R″ is hydrogen or a CH$_2$COOH group such that the CH$_2$COOH group accounts for 10 to 100 mol % of R″ in each compound, α and κ are as defined above.
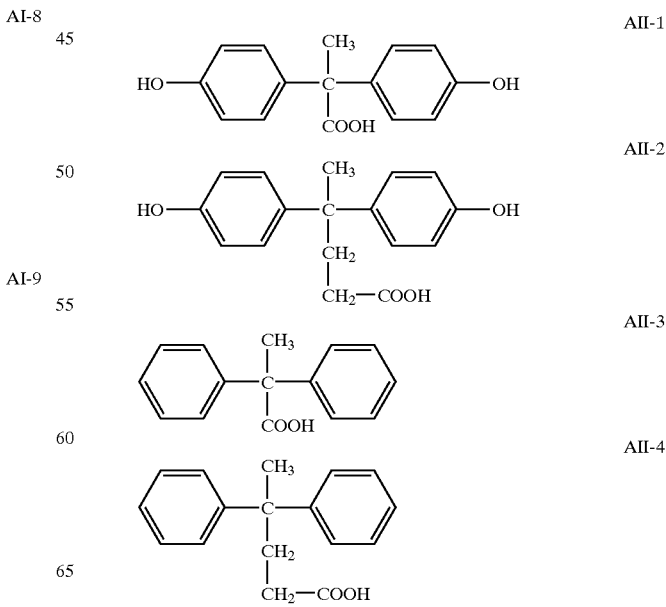
AII-1
AII-2
AII-3
AII-4

-continued

AII-5
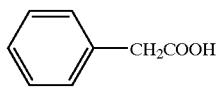

AII-6
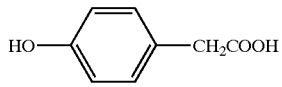

AII-7
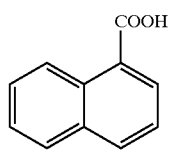

AII-8
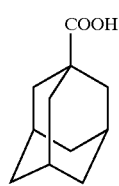

AII-9
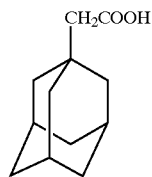

AII-10
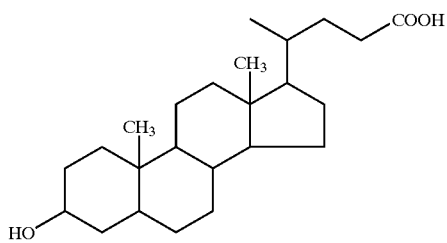

The compound bearing a ≡C—COOH group within the molecule may be used singly or as combinations of two or more thereof.

The compound bearing a ≡C—COOH group within the molecule is added in an amount ranging from 0 to 5 parts, preferably 0.1 to 5 parts, more preferably 0.1 to 3 parts, further preferably 0.1 to 2 parts, per 100 parts of the base resin. More than 5 parts of the compound can reduce the resolution of the resist composition.

The resist composition of the invention may additionally include an acetylene alcohol derivative for the purpose of enhancing the shelf stability. Preferred acetylene alcohol derivatives are those having the general formula (S1) or (S2) below.

S1
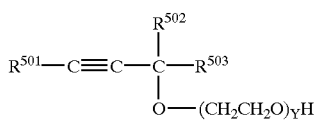

S2
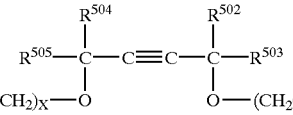

In the formulas, $R^{501}$, $R^{502}$, $R^{503}$, $R^{504}$, and $R^{505}$ are each hydrogen or a straight, branched, or cyclic alkyl of 1 to 8 carbon atoms; and X and Y are each 0 or a positive number, satisfying $0 \leq X \leq 30$, $0 \leq Y \leq 30$, and $0 \leq X+Y \leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industry K.K.

The acetylene alcohol derivative is preferably added in an amount of 0.01 to 2% by weight, and more preferably 0.02 to 1% by weight, per 100% by weight of the resist composition. Less than 0.01% by weight would be ineffective for improving coating characteristics and shelf stability, whereas more than 2% by weight would result in a resist having a low resolution.

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Florade FC-430 and FC-431 from Sumitomo 3M, Ltd., Surflon S-141 and S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Florade FC-430 from Sumitomo 3M, Ltd., KH-20 and KH-30 from Asahi Glass Co., Ltd., and X-70-093 from Shin-Etsu Chemical Co., Ltd.

Pattern formation using the resist composition of the invention may be carried out by a known lithographic technique. For example, the resist composition is applied onto a substrate such as a silicon wafer by spin coating or the like to form a resist film having a thickness of 0.2 to 2.0 μm, which is then pre-baked on a hot plate at 60 to 150° C. for 1 to 10 minutes, and preferably at 80 to 130° C. for 1 to 5 minutes. A patterning mask having the desired pattern is then placed over the resist film, and the film exposed through the mask to an electron beam or to high-energy radiation such as deep-UV rays, an excimer laser, or x-rays in a dose of about 1 to 200 mJ/cm², and preferably about 5 to 100 mJ/cm², then post-exposure baked (PEB) on a hot plate at 60 to 150° C. for 1 to 5 minutes, and preferably at 80 to 130° C. for 1 to 3 minutes. Finally, development is carried out using as the developer an aqueous alkali solution, such as a 0.1 to 5% (preferably 2 to 3%) aqueous solution of tetramethylammonium hydroxide (TMAH), this being done by a conventional method such as dipping, puddling, or spraying for a period of 0.1 to 3 minutes, and preferably 0.5 to 2 minutes. These steps result in the formation of the desired pattern on the substrate. Of the various types of high-energy radiation that may be used, the resist composition of the invention is best suited to fine pattern formation with, in particular, deep-UV rays having a wavelength of 248 to 193 nm, an excimer laser, x-rays, or an electron beam. The desired pattern may not be obtainable outside the upper and lower limits of the above range.

The resist composition comprising the two specific polymers as a base resin lends itself to micropatterning with electron beams or deep-UV rays since it is sensitive to high-energy radiation and has excellent sensitivity, resolution, and etching resistance. Especially because of the minimized absorption at the exposure wavelength of an ArF or KrF excimer laser, a finely defined pattern having sidewalls perpendicular to the substrate can easily be formed.

EXAMPLE

Synthesis Examples and Examples are given below by way of illustration and not by way of limitation. The abbreviation Me is methyl, iPr is isopropyl, and Mw is a weight average molecular weight as measured by GPC using a polystyrene standard.

Polymers used in the resist compositions of the invention were synthesized by the following procedure.

Synthesis Example 1
Synthesis of Polymer 1

In a nitrogen atmosphere, 17.0 g of 4,10-dioxatricyclo [5.2.1.0$^{2,6}$]dec-8-en-3-one, 29.0 g of tert-butyl tetracyclo [4.4.0.1$^{2,5}$.1$^{2,5}$.1$^{7,10}$]-8-dodecene-3-carboxylate and 489.0 g of tetrahydrofuran were mixed. To the mixture were added 1,038 mg of 1,5-hexadiene and 786 mg of Mo(N-2,6-iPr$_2$C$_6$H$_3$)(CHCMe$_3$)(OC(CF$_3$)$_2$Me)$_2$. With stirring, the mixture was kept for 2 hour at room temperature for reaction to take place. Thereafter, 404 mg of butylaldehyde was added to the reaction mixture, which was stirred for a further 30 minutes, and the reaction was terminated. The reaction mixture was added dropwise to a large excess of methanol. The solids precipitated were filtered, washed with methanol and dried in vacuum, obtaining a ring-opening metathesis polymer in powder form. The amount was 38.6 g and the yield was 83.9%.

Then, 37.0 g of the ring-opening metathesis polymer powder, 350.0 g of tetrahydrofuran and 20 mg of chlorohydridocarbonyltris(triphenylphosphine)ruthenium were mixed. The mixture was kept for 20 hours at 100° C. and a hydrogen pressure of 6.0 MPa for reaction to take place. The reaction mixture was cooled to room temperature, and the hydrogen was withdrawn to terminate the reaction. This was added dropwise to a large excess of methanol. The solids precipitated were filtered, washed with methanol and dried in vacuum, obtaining a hydrogenated product of ring-opening metathesis polymer, designated Polymer 1, in powder form. The amount was 36.5 g and the yield was 99.6%.

Synthesis Examples 2 to 11
Synthesis of Polymers 2 to 11

Polymers 2 to 11 were synthesized by the same procedure as above or a well-known procedure.

Synthesis Example 12
Synthesis of Polymer 12

117.0 g of 2-methyl-2-adamantyl methacrylate, 85.0 g of 2-oxo-4-oxoranyl, 1.40 g of 2-mercaptoethanol and 505.0 g of tetrahydrofuran were mixed. The mixture was heated at 60° C., and 3.28 g of 2,2'-azobisisobutyronitrile was added thereto. The mixture was stirred for 15 hours while keeping at 60° C. The reaction mixture was cooled to room temperature, and dissolved in 500 ml of acetone. With vigorous stirring, the solution was added dropwise to 10 liters of isopropyl alcohol. The solids precipitated were filtered, and dried in vacuum at 40° C. for 15 hours, obtaining a polymer, designated Polymer 9, in white powdery solid form. The amount was 180.0 g, and the yield was 89.1%.

Synthesis Examples 13 to 27

Synthesis of Polymers 13 to 27

Polymers 13 to 27 were synthesized by the same procedure as above or a well-known procedure.

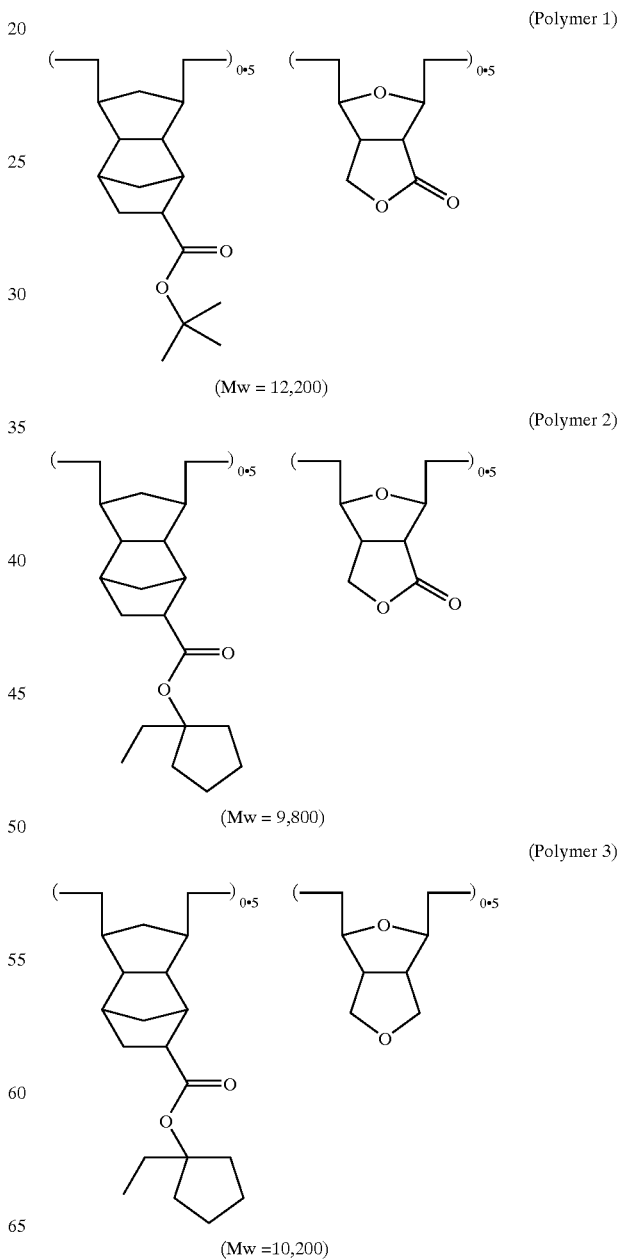

(Polymer 4)
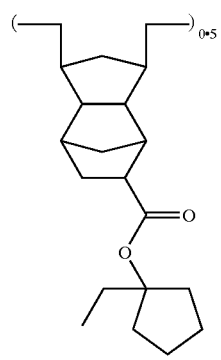
(Mw = 9,900)
(Polymer 5)
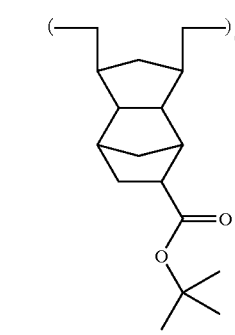
(Mw = 11,000)
(Polymer 6)
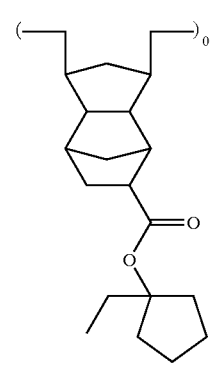
(Mw = 9,200)
(Polymer 7)
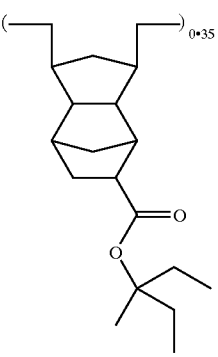
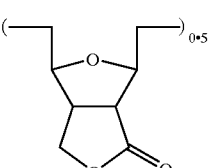
(Mw = 10,700)
(Polymer 8)
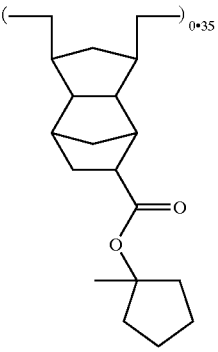
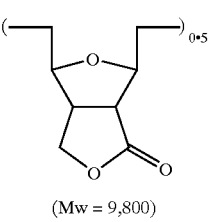
(Mw = 9,800)
(Polymer 9)
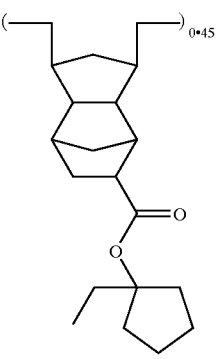

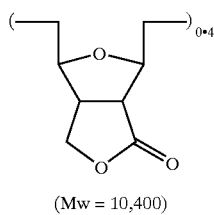
(Mw = 10,400)
(Polymer 10)
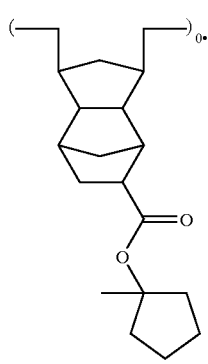
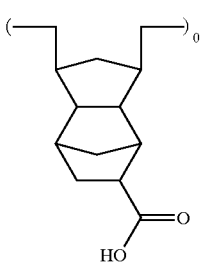
(Mw = 11,000)
(Polymer 11)
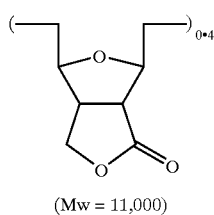
(Mw = 10,300)
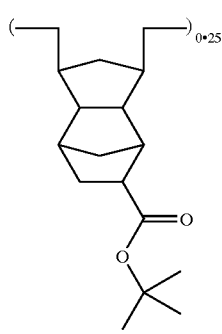
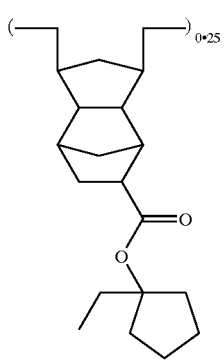
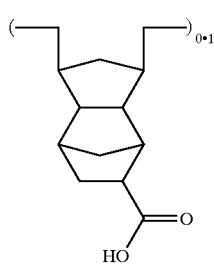
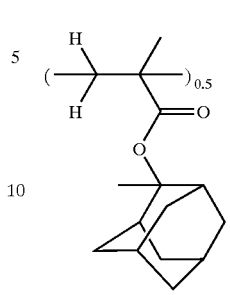
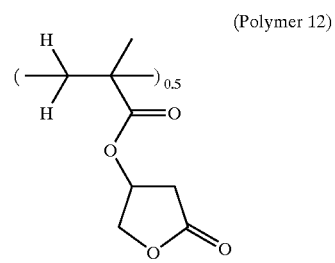
(Polymer 12)
(Mw = 8,800)
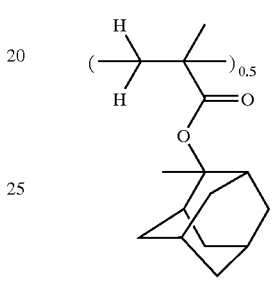
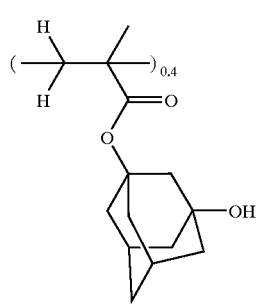
(Polymer 13)
(Mw = 12,100)
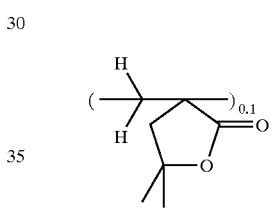
(Polymer 14)
(Mw = 8,500)
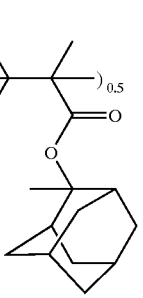
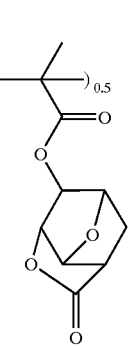
(Polymer 15)
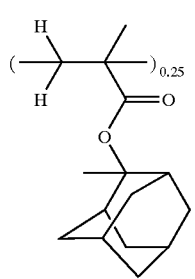
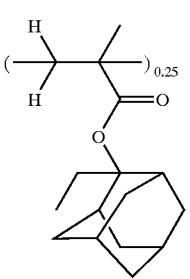

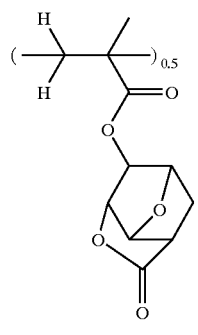
(Mw = 8,100)
(Polymer 16)
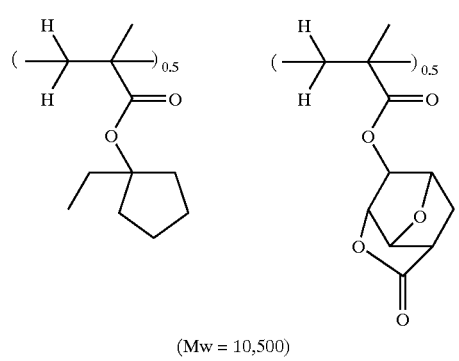
(Mw = 10,500)
(Polymer 17)
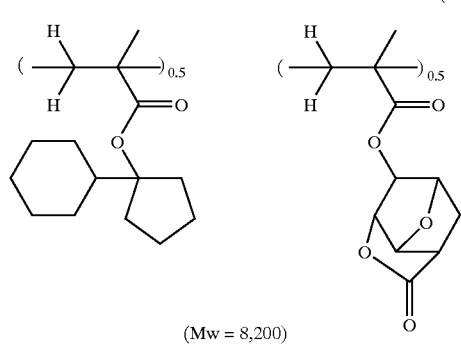
(Mw = 8,200)
(Polymer 18)
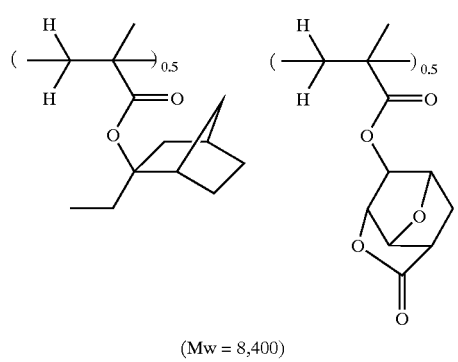
(Mw = 8,400)
(Polymer 19)
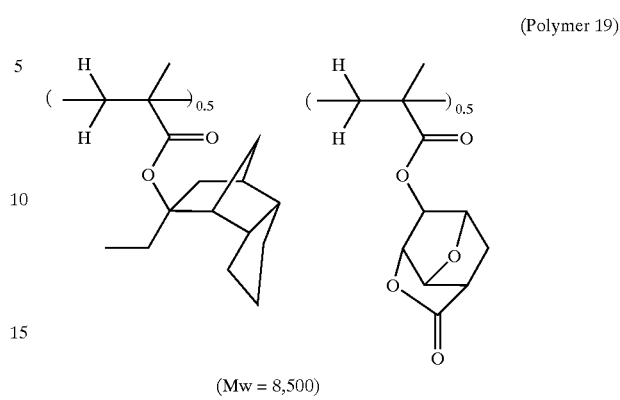
(Mw = 8,500)
(Polymer 20)
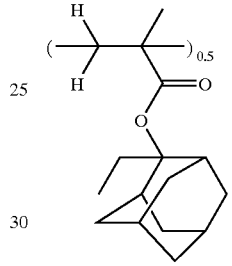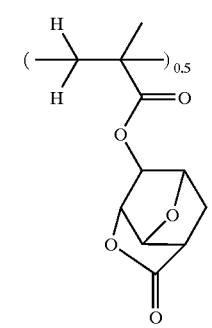
(Mw = 8,200)
(Polymer 21)
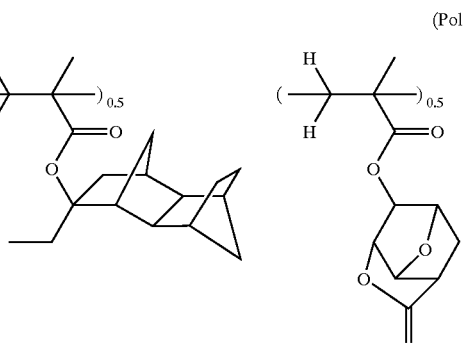
(Mw = 8,400)
(Polymer 22)
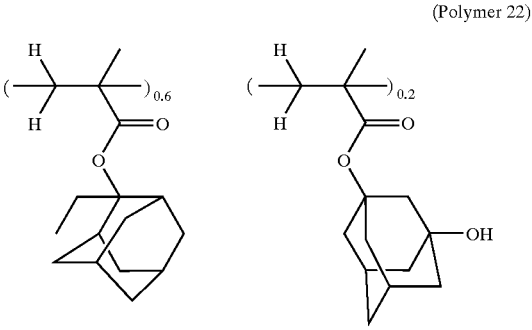

-continued
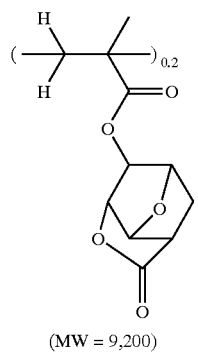
(MW = 9,200)
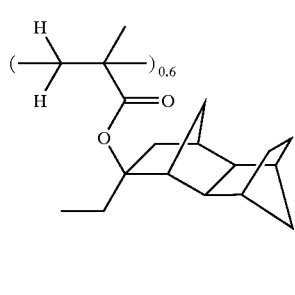
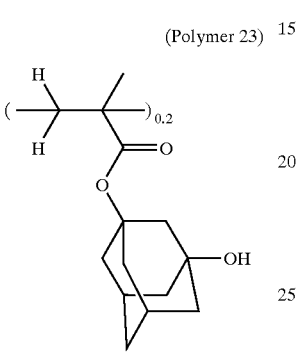
(Polymer 23)
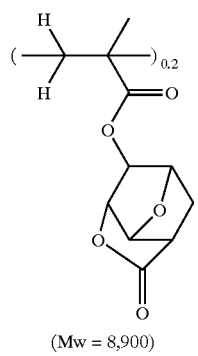
(Mw = 8,900)
(Polymer 24)
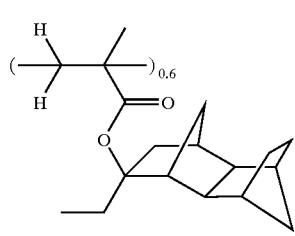
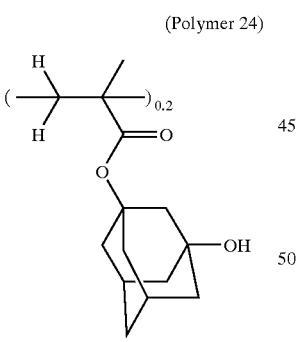
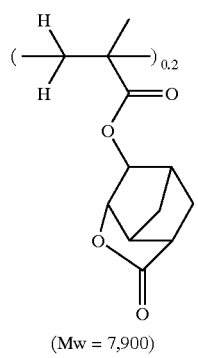
(Mw = 7,900)
-continued
(Polymer 25)
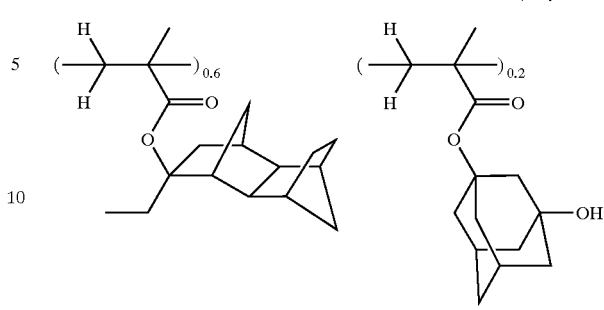
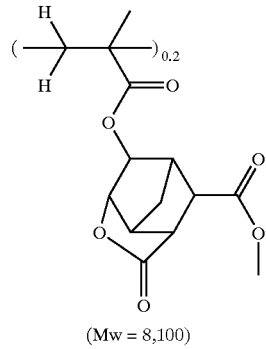
(Mw = 8,100)
(Polymer 26)
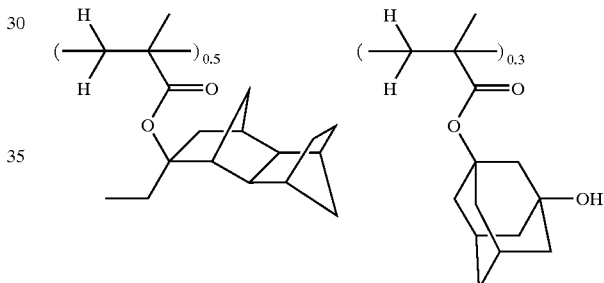
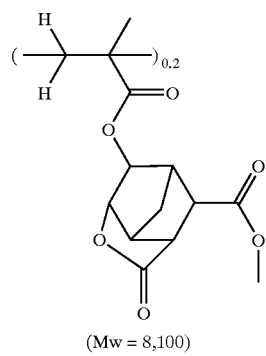
(Mw = 8,100)
(Polymer 27)
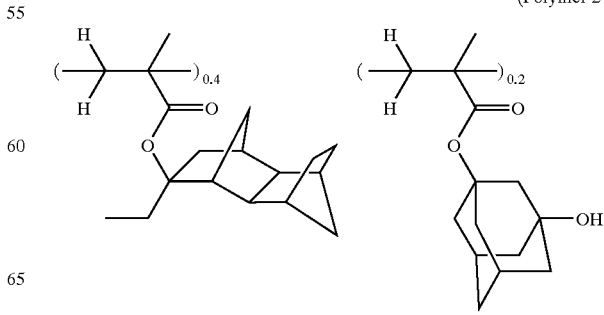

-continued

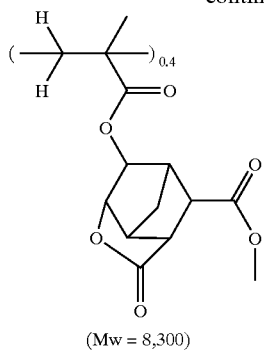

(Mw = 8,300)

EXAMPLE

Resist compositions were formulated using inventive polymers and examined for resolution.

Examples 1–48 & Comparative Examples 1–31

Resist compositions were prepared by mixing the hydrogenated products of ring-opening metathesis polymer (Polymers 1 to 11) plus the poly(meth)acrylic acid derivative (Polymers 12 to 27) or comparative polymer (Polymers 28 to 31 identified below) as the base resin, a photoacid generator, a basic compound, and a solvent in accordance with the formulation shown in Tables 1 to 3. These compositions were each filtered through a Teflons filter (pore diameter 0.2 μm), thereby giving resist solutions.

(Polymer 28)

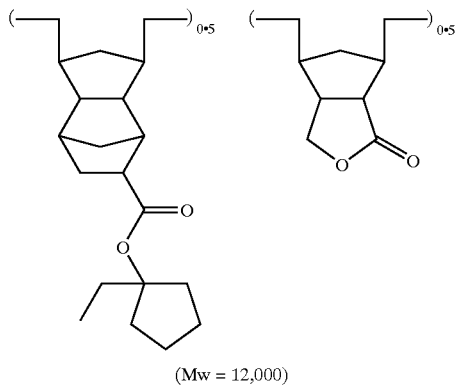

(Mw = 12,000)

(Polymer 29)

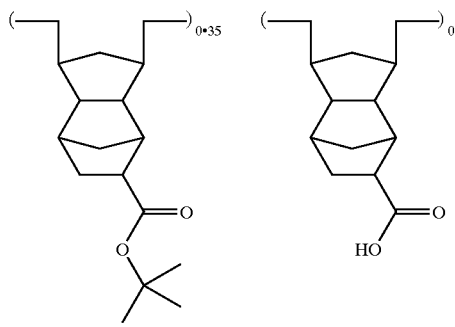

-continued

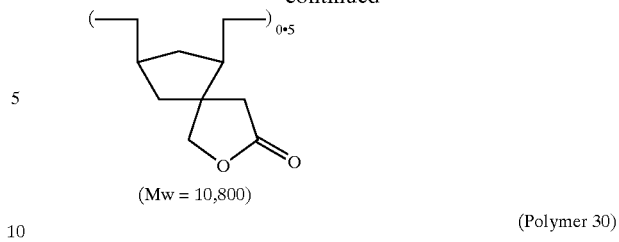

(Mw = 10,800)

(Polymer 30)

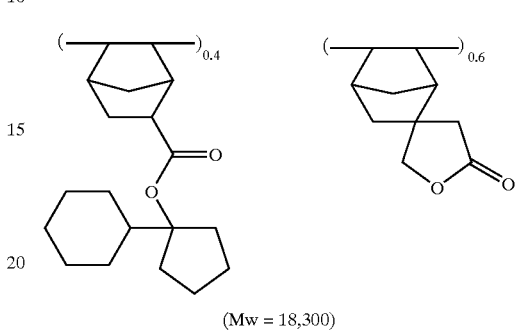

(Mw = 18,300)

(Polymer 31)

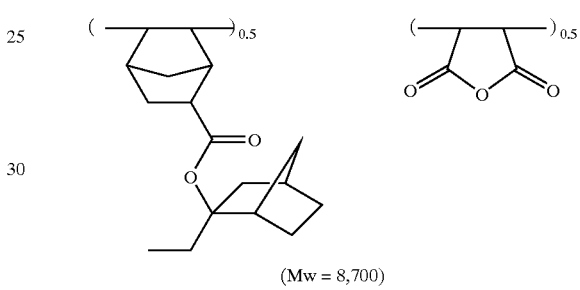

(Mw = 8,700)

These resist solutions were spin-coated onto silicon wafers having an anti-reflection film (ARC25 by Nissan Chemical Co., Ltd., 77 nm) coated thereon, then heat treated at 130° C. for 60 seconds to give resist films having a thickness of 375 nm. The resist films were exposed using an ArF excimer laser stepper (Nikon Corporation; NA 0.55), then heat treated at 110° C., 120° C. or 130° C. for 60 seconds, and puddle developed with an aqueous solution of 2.38% tetramethylammonium hydroxide for 60 seconds, thereby giving 1:1 line-and-space patterns. The developed wafers were cut, and the cross section was observed under a sectional scanning electron microscope (SEM). The optimum dose (Eop, mJ/cm$^2$) was defined as the dose which provided a 1:1 resolution at the top and bottom of a 0.20 μm line-and-space pattern. The resolution of the resist under evaluation was defined as the minimum line width (μm) of the lines and spaces that separated at this dose. The shape of the resist pattern was rated "○" (good) or "X" (poor). For evaluating etch resistance, a resist film formed on a silicon wafer by the same procedure as above was etched using an etching apparatus (Tokyo Electron K.K.), and an etch rate was determined using SEPR-430S (Shin-Etsu Chemical Co., Ltd.) as a reference.

The composition and test results of the resist materials in Examples are shown in Tables 1 and 2. The composition and test results of the resist materials in Comparative Examples are shown in Table 3.

The photoacid generator, basic compound and solvents used are shown below. It is noted that the solvents contained 0.01% by weight of surfactant FC-430 (Sumitomo 3M, Ltd.).

TPSNf: triphenylsulfonium nonafluorobutanesulfonate
TMMEA: trismethoxymethoxyethylamine
PGMEA: propylene glycol methyl ether acetate
CyHO: cyclohexanone

TABLE 1

| Example | Resin (pbw) | Photoacid generator (pbw) | Basic compound (pbw) | Solvent (pbw) | PEB temp., °C. | Eop, mJ/cm² | Resolution, μm | Shape | Etch rate |
|---|---|---|---|---|---|---|---|---|---|
| 1 | Polymer 1 (40) Polymer 12 (40) | TPSNf (1.090) | TMMEA (0.236) | CyHO (560) | 130 | 30.0 | 0.18 | ○ | 1.07 |
| 2 | Polymer 2 (40) Polymer 12 (40) | TPSNf (1.090) | TMMEA (0.236) | CyHO (560) | 110 | 27.0 | 0.17 | ○ | 1.05 |
| 3 | Polymer 3 (40) Polymer 12 (40) | TPSNf (1.090) | TMMEA (0.236) | CyHO (560) | 110 | 26.0 | 0.17 | ○ | 1.05 |
| 4 | Polymer 4 (40) Polymer 12 (40) | TPSNf (1.090) | TMMEA (0.236) | CyHO (560) | 110 | 26.0 | 0.17 | ○ | 1.06 |
| 5 | Polymer 5 (40) Polymer 12 (40) | TPSNf (1.090) | TMMEA (0.236) | CyHO (560) | 130 | 29.0 | 0.17 | ○ | 1.08 |
| 6 | Polymer 6 (40) Polymer 12 (40) | TPSNf (1.090) | TMMEA (0.236) | CyHO (560) | 110 | 26.0 | 0.17 | ○ | 1.07 |
| 7 | Polymer 7 (40) Polymer 12 (40) | TPSNf (1.090) | TMMEA (0.236) | CyHO (560) | 110 | 27.0 | 0.17 | ○ | 1.09 |
| 8 | Polymer 8 (40) Polymer 12 (40) | TPSNf (1.090) | TMMEA (0.236) | CyHO (560) | 120 | 27.0 | 0.17 | ○ | 1.08 |
| 9 | Polymer 9 (40) Polymer 12 (40) | TPSNf (1.090) | TMMEA (0.236) | CyHO (560) | 110 | 25.0 | 0.18 | ○ | 1.08 |
| 10 | Polymer 10 (40) Polymer 12 (40) | TPSNf (1.090) | TMMEA (0.236) | CyHO (560) | 120 | 29.0 | 0.17 | ○ | 1.04 |
| 11 | Polymer 11 (40) Polymer 12 (40) | TPSNf (1.090) | TMMEA (0.236) | CyHO (560) | 130 | 27.0 | 0.17 | ○ | 1.06 |
| 12 | Polymer 5 (40) Polymer 13 (40) | TPSNf (1.090) | TMMEA (0.236) | CyHO (560) | 130 | 30.0 | 0.17 | ○ | 1.07 |
| 13 | Polymer 5 (40) Polymer 14 (40) | TPSNf (1.090) | TMMEA (0.236) | CyHO (560) | 130 | 29.0 | 0.17 | ○ | 1.05 |
| 14 | Polymer 5 (40) Polymer 15 (40) | TPSNf (1.090) | TMMEA (0.236) | CyHO (560) | 130 | 28.0 | 0.17 | ○ | 1.03 |
| 15 | Polymer 5 (40) Polymer 16 (40) | TPSNf (1.090) | TMMEA (0.236) | CyHO (560) | 120 | 29.0 | 0.18 | ○ | 1.10 |
| 16 | Polymer 5 (40) Polymer 17 (40) | TPSNf (1.090) | TMMEA (0.236) | CyHO (560) | 120 | 26.0 | 0.17 | ○ | 1.08 |
| 17 | Polymer 5 (40) Polymer 18 (40) | TPSNf (1.090) | TMMEA (0.236) | CyHO (560) | 120 | 27.0 | 0.17 | ○ | 1.08 |
| 18 | Polymer 5 (40) Polymer 19 (40) | TPSNf (1.090) | TMMEA (0.236) | CyHO (560) | 120 | 27.0 | 0.17 | ○ | 1.07 |
| 19 | Polymer 5 (40) Polymer 20 (40) | TPSNf (1.090) | TMMEA (0.236) | CyHO (560) | 120 | 25.0 | 0.18 | ○ | 1.06 |
| 20 | Polymer 5 (40) Polymer 21 (40) | TPSNf (1.090) | TMMEA (0.236) | CyHO (560) | 120 | 26.0 | 0.17 | ○ | 1.06 |
| 21 | Polymer 5 (40) Polymer 22 (40) | TPSNf (1.090) | TMMEA (0.236) | CYHO (560) | 120 | 30.0 | 0.17 | ○ | 1.03 |
| 22 | Polymer 5 (40) Polymer 23 (40) | TPSNf (1.090) | TMMEA (0.236) | CyHO (560) | 120 | 29.0 | 0.17 | ○ | 1.04 |
| 23 | Polymer 5 (40) Polymer 24 (40) | TPSNf (1.090) | TMMEA (0.236) | CyHO (560) | 120 | 28.0 | 0.17 | ○ | 1.04 |
| 24 | Polymer 5 (40) Polymer 25 (40) | TPSNf (1.090) | TMMEA (0.236) | CyHO (560) | 120 | 28.0 | 0.17 | ○ | 1.05 |
| 25 | Polymer 5 (40) Polymer 26 (40) | TPSNf (1.090) | TMMEA (0.236) | CyHO (560) | 120 | 30.0 | 0.18 | ○ | 1.06 |
| 26 | Polymer 5 (40) Polymer 27 (40) | TPSNf (1.090) | TMMEA (0.236) | CyHO (560) | 120 | 32.0 | 0.18 | ○ | 1.07 |
| 27 | Polymer 6 (40) Polymer 13 (40) | TPSNf (1.090) | TMMEA (0.236) | CyHO (560) | 110 | 28.0 | 0.17 | ○ | 1.02 |
| 28 | Polymer 6 (40) Polymer 14 (40) | TPSNf (1.090) | TMMEA (0.236) | CyHO (560) | 110 | 28.0 | 0.17 | ○ | 1.03 |
| 29 | Polymer 6 (40) Polymer 15 (40) | TPSNf (1.090) | TMMEA (0.236) | CyHO (560) | 110 | 27.0 | 0.17 | ○ | 1.01 |
| 30 | Polymer 6 (40) Polymer 16 (40) | TPSNf (1.090) | TMMEA (0.236) | CyHO (560) | 110 | 27.0 | 0.17 | ○ | 1.09 |

TABLE 2

| Example | Resin (pbw) | Photoacid generator (pbw) | Basic compound (pbw) | Solvent (pbw) | PEB temp., °C. | Eop, mJ/cm² | Resolution, μm | Shape | Etch rate |
|---|---|---|---|---|---|---|---|---|---|
| 31 | Polymer 6 (40) Polymer 17 (40) | TPSNf (1.090) | TMMEA (0.236) | CyHO (560) | 110 | 25.0 | 0.17 | ○ | 1.06 |
| 32 | Polymer 6 (40) Polymer 18 (40) | TPSNf (1.090) | TMMEA (0.236) | CyHO (560) | 110 | 26.0 | 0.17 | ○ | 1.04 |

TABLE 2-continued

| Example | Resin (pbw) | Photoacid generator (pbw) | Basic compound (pbw) | Solvent (pbw) | PEB temp., °C | Eop, mJ/cm$^2$ | Resolution, μm | Shape | Etch rate |
|---|---|---|---|---|---|---|---|---|---|
| 33 | Polymer 6 (40) Polymer 19 (40) | TPSNf (1.090) | TMMEA (0.236) | CyHO (560) | 110 | 25.0 | 0.17 | ○ | 1.03 |
| 34 | Polymer 6 (40) Polymer 20 (40) | TPSNf (1.090) | TMMEA (0.236) | CyHO (560) | 110 | 27.0 | 0.18 | ○ | 1.03 |
| 35 | Polymer 6 (40) Polymer 21 (40) | TPSNf (1.090) | TMMEA (0.236) | CyHO (560) | 110 | 28.0 | 0.18 | ○ | 1.01 |
| 36 | Polymer 6 (40) Polymer 22 (40) | TPSNf (1.090) | TMMEA (0.236) | CyHO (560) | 110 | 24.0 | 0.17 | ○ | 1.01 |
| 37 | Polymer 6 (40) Polymer 23 (40) | TPSNf (1.090) | TMMEA (0.236) | CyHO (560) | 110 | 25.0 | 0.17 | ○ | 1.02 |
| 38 | Polymer 6 (40) Polymer 24 (40) | TPSNf (1.090) | TMMEA (0.236) | CyHO (560) | 110 | 26.0 | 0.17 | ○ | 1.01 |
| 39 | Polymer 6 (40) Polymer 25 (40) | TPSNf (1.090) | TMMEA (0.236) | CyHO (560) | 110 | 25.0 | 0.16 | ○ | 1.03 |
| 40 | Polymer 6 (40) Polymer 26 (40) | TPSNf (1.090) | TMMEA (0.236) | CyHO (560) | 110 | 28.0 | 0.16 | ○ | 1.05 |
| 41 | Polymer 6 (40) Polymer 27 (40) | TPSNf (1.090) | TMMEA (0.236) | CyHO (560) | 110 | 30.0 | 0.18 | ○ | 1.06 |
| 42 | Polymer 5 (60) Polymer 12 (20) | TPSNf (1.090) | TMMEA (0.236) | CyHO (560) | 130 | 29.0 | 0.19 | ○ | 1.02 |
| 43 | Polymer 5 (20) Polymer 12 (60) | TPSNf (1.090) | TMMEA (0.236) | CyHO (560) | 130 | 26.0 | 0.17 | ○ | 1.15 |
| 44 | Polymer 6 (60) Polymer 12 (20) | TPSNf (1.090) | TMMEA (0.236) | CyHO (560) | 110 | 28.0 | 0.18 | ○ | 1.03 |
| 45 | Polymer 6 (20) Polymer 12 (60) | TPSNf (1.090) | TMMEA (0.236) | CyHO (560) | 110 | 25.0 | 0.16 | ○ | 1.15 |
| 47 | Polymer 5 (20) Polymer 6 (20) Polymer 12 (40) | TPSNf (1.090) TPSNf | TMMEA (0.236) TMMEA | CyHO (560) CyHO | 110 | 27.0 | 0.17 | ○ | 1.07 |
| 48 | Polymer 6 (40) Polymer 12 (20) Polymer 13 (20) | (1.090) TPSNf (1.090) | (0.236) TMMEA (0.236) | (560) CyHO (560) | 110 | 27.0 | 0.17 | ○ | 1.06 |

TABLE 3

| Comparative Example | Resin (pbw) | Photoacid generator (pbw) | Basic compound (pbw) | Solvent (pbw) | PEB temp., °C | Eop, mJ/cm$^2$ | Resolution, μm | Shape | Etch rate |
|---|---|---|---|---|---|---|---|---|---|
| 1 | Polymer 1 (80) | TPSNf (1.090) | TMMEA (0.236) | CyHO (560) | 130 | 32.0 | 0.20 | ○ | 0.98 |
| 2 | Polymer 2 (80) | TPSNf (1.090) | TMMEA (0.236) | CyHO (560) | 110 | 28.0 | 0.19 | ○ | 0.97 |
| 3 | Polymer 3 (80) | TPSNf (1.090) | TMMEA (0.236) | CyHO (560) | 110 | 28.0 | 0.19 | ○ | 0.96 |
| 4 | Polymer 4 (80) | TPSNf (1.090) | TMMEA (0.236) | CyHO (560) | 110 | 28.0 | 0.20 | ○ | 0.96 |
| 5 | Polymer 5 (80) | TPSNf (1.090) | TMMEA (0.236) | CyHO (560) | 130 | 30.0 | 0.19 | ○ | 0.99 |
| 6 | Polymer 6 (80) | TPSNf (1.090) | TMMEA (0.236) | CyHO (560) | 110 | 27.0 | 0.19 | ○ | 0.98 |
| 7 | Polymer 7 (80) | TPSNf (1.090) | TMMEA (0.236) | CyHO (560) | 110 | 28.0 | 0.19 | ○ | 1.00 |
| 8 | Polymer 8 (80) | TPSNf (1.090) | TMMEA (0.236) | CyHO (560) | 120 | 28.0 | 0.19 | ○ | 1.08 |
| 9 | Polymer 9 (80) | TPSNf (1.090) | TMMEA (0.236) | CyHO (560) | 110 | 29.0 | 0.17 | ○ | 0.98 |
| 10 | Polymer 10 (80) | TPSNf (1.090) | TMMEA (0.236) | CyHO (560) | 120 | 29.0 | 0.17 | ○ | 0.95 |
| 11 | Polymer 11 (80) | TPSNf (1.090) | TMMEA (0.236) | CyHO (560) | 130 | 28.0 | 0.19 | ○ | 0.96 |
| 12 | Polymer 12 (80) | TPSNf (1.090) | TMMEA (0.236) | PGMEA (480) | 130 | 24.0 | 0.17 | ○ | 1.33 |
| 13 | Polymer 13 (80) | TPSNf (1.090) | TMMEA (0.236) | PGMEA (480) | 130 | 28.0 | 0.17 | ○ | 1.26 |
| 14 | Polymer 14 (80) | TPSNf (1.090) | TMMEA (0.236) | PGMEA (480) | 130 | 27.0 | 0.17 | ○ | 1.25 |

TABLE 3-continued

| Comparative Example | Resin (pbw) | Photoacid generator (pbw) | Basic compound (pbw) | Solvent (pbw) | PEB temp., °C. | Eop, mJ/cm² | Resolution, μm | Shape | Etch rate |
|---|---|---|---|---|---|---|---|---|---|
| 15 | Polymer 15 (80) | TPSNf (1.090) | TMMEA (0.236) | PGMEA (480) | 130 | 27.0 | 0.17 | ○ | 1.20 |
| 16 | Polymer 16 (80) | TPSNf (1.090) | TMMEA (0.236) | PGMEA (480) | 110 | 24.0 | 0.18 | ○ | 1.36 |
| 17 | Polymer 17 (80) | TPSNf (1.090) | TMMEA (0.236) | PGMEA (480) | 110 | 28.0 | 0.17 | ○ | 1.33 |
| 18 | Polymer 18 (80) | TPSNf (1.090) | TMMEA (0.236) | PGMEA (480) | 110 | 27.0 | 0.16 | ○ | 1.32 |
| 19 | Polymer 19 (80) | TPSNf (1.090) | TMMEA (0.236) | PGMEA (480) | 110 | 27.0 | 0.16 | ○ | 1.29 |
| 20 | Polymer 20 (80) | TPSNf (1.090) | TMMEA (0.236) | PGMEA (480) | 120 | 24.0 | 0.17 | ○ | 1.25 |
| 21 | Polymer 21 (80) | TPSNf (1.090) | TMMEA (0.236) | PGMEA (480) | 110 | 25.0 | 0.17 | ○ | 1.26 |
| 22 | Polymer 22 (80) | TPSNf (1.090) | TMMEA (0.236) | PGMEA (480) | 120 | 24.0 | 0.16 | ○ | 1.20 |
| 23 | Polymer 23 (80) | TPSNf (1.090) | TMMEA (0.236) | PGMEA (480) | 110 | 26.0 | 0.16 | ○ | 1.22 |
| 24 | Polymer 24 (80) | TPSNf (1.090) | TMMEA (0.236) | PGMEA (480) | 110 | 29.0 | 0.17 | ○ | 1.20 |
| 25 | Polymer 25 (80) | TPSNf (1.090) | TMMEA (0.236) | PGMEA (480) | 110 | 28.0 | 0.16 | ○ | 1.23 |
| 26 | Polymer 26 (80) | TPSNf (1.090) | TMMEA (0.236) | PGMEA (480) | 110 | 32.0 | 0.17 | ○ | 1.25 |
| 27 | Polymer 27 (80) | TPSNf (1.090) | TMMEA (0.236) | PGMEA (480) | 120 | 27.0 | 0.17 | ○ | 1.29 |
| 28 | Polymer 28 (40) Polymer 12 (40) | TPSNf (1.090) | TMMEA (0.236) | CyHO (560) | — | — | — | X (*1) | — |
| 29 | Polymer 29 (40) Polymer 12 (40) | TPSNf (1.090) | TMMEA (0.236) | CyHO (560) | — | — | — | X (*1) | — |
| 30 | Polymer 30 (40) Polymer 12 (40) | TPSNf (1.090) | TMMEA (0.236) | CyHO (560) | — | — | — | X (*1) | — |
| 31 | Polymer 31 (40) Polymer 12 (40) | TPSNf (1.090) | TMMEA (0.236) | PGMEA (480) | 120 | 26.0 | 0.16 | X (*2) | — |

(*1) film not formed due to phase separation
(*2) partial stripping of film upon development It is seen from Tables 1 to 3 that the resist compositions within the scope of the invention have a high resolution and satisfactory etch resistance.

Japanese Patent Application No. 2001-181079 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A resist composition comprising a hydrogenated product of a ring-opening metathesis polymer and a poly(meth)acrylic acid derivative as a base resin, wherein the hydrogenated product of the ring-opening metathesis polymer is a polymer comprising recurring units of the following formula (1) and having a eight average molecular weight of 500 to 200,000,

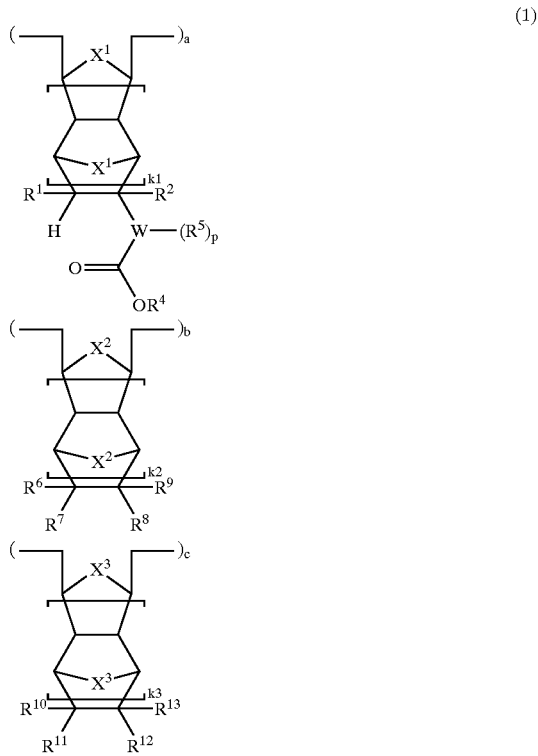

wherein $R^1$ is hydrogen, methyl or $CH_2CO_2R^3$;

$R^2$ is hydrogen, methyl or $CO_2R^3$;

$R^3$ which may be identical or different between $R^1$ and $R^2$ is a straight, branched or cyclic alkyl group of 1 to 15 carbon atoms;

$R^4$ is an acid labile group;

$R^5$ is a halogen atom, a hydroxyl group, a straight, branched or cyclic alkoxy, acyloxy or alkylsulfonyloxy group having 1 to 15 carbon atoms, or a straight, branched or cyclic alkoxycarbonyloxy or alkoxyalkoxy group having 2 to 15 carbon atoms, in which some or all of the hydrogen atoms on constituent carbon atoms may be substituted with halogen atoms;

at least one of $R^6$ to $R^9$ is a monovalent hydrocarbon group of 1 to 15 carbon atoms having a carboxyl or hydroxyl group while the remaining $R^6$ to $R^9$ are independently hydrogen or straight, branched or cyclic alkyl groups of 1 to 15 carbon atoms, or $R^6$ to $R^9$, taken together, may form a ring, and in that event, at least one of $R^6$ to $R^9$ is a divalent hydrocarbon group of 1 to 15 carbon atoms having a carboxyl or hydroxyl group while the remaining $R^6$ to $R^9$ are independently single bonds or straight, branched or cyclic alkylene groups of 1 to 15 carbon atoms;

at least one of $R^{10}$ to $R^{13}$ is a monovalent hydrocarbon group of 2 to 15 carbon atoms containing at least one partial structure selected from among ether, aldehyde, ketone, ester, carbonate, acid anhydride, amide and imide while the remaining $R^{10}$ to $R^{13}$ are independently hydrogen or straight, branched or cyclic alkyl groups of 1 to 15 carbon atom or $R^{10}$ to $R^{13}$, taken together, may form a ring, and in that event, at least one of $R^{10}$ to $R^{13}$ is a divalent hydrocarbon group of 1 to 15 carbon atoms containing at least one partial structure selected from among ether, aldehyde, ketone, ester, carbonate, acid anhydride, amide and imide, while the remaining $R^{10}$ to $R^{13}$ are independently single bonds or straight, branched or cyclic alkylene groups of 1 to 15 carbon atoms;

$X^1$ to $X^3$ each are independently a methylene group or oxygen atom, with the proviso that all $X^1$ to $X^3$ are not methylene groups at the same time;

W is a single bond or a straight, branched or cyclic (p+2)-valent hydrocarbon group having 1 to 5 carbon atoms, in which at least one methylene group may be substituted with an oxygen atom to form a chain-like or cyclic ether or two hydrogen atoms on a common carbon may be substituted with an oxygen atom to form a ketone;

$k^1$ to $k^3$ each are independently 0 or 1, p is 0, 1 or 2, "a," "b" and "c" representative of compositional ratios of the corresponding recurring units are such numbers that $0<a<1$, $0\leq b<1$, $0\leq c<1$ and $a+b+c=1$, the recurring units introduced in the respective compositional ratios "b" "b" and "c" each may be of one or more types.

2. The resist composition of claim 1, wherein the poly (meth)acrylic acid derivative is a polymer comprising recurring units of the formula (2):

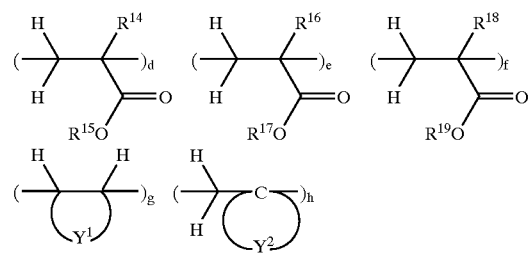

(2)

wherein $R^{14}$, $R^{16}$ and $R^{18}$ each are independently hydrogen or methyl, $R^{15}$ is an acid labile group, $R^{17}$ is hydrogen or a monovalent hydrocarbon group of 1 to 15 carbon atoms containing a carboxyl or hydroxyl group, $R^{19}$ is a monovalent hydrocarbon group of 2 to 15 carbon atoms containing at least one partial structure selected from among ether, aldehyde, ketone, ester, carbonate, acid anhydride, amide and imide, $Y^1$ is a group of atoms forming a 5- or 6-membered ring with the two carbon atoms to which it is attached, the ring containing at least one partial structure selected from among ester, carbonate, acid anhydride, amide and imide, $Y^2$ is a group of atoms forming a 5- or 6-membered ring with the carbon atom to which it is attached, the ring containing at least one partial structure selected from among ester, carbonate, acid anhydride, amide and imide, the letters d, e, f, g and h, representative of compositional ratios of the corresponding recurring units, are such numbers that d is from more than 0 to less than 1, each of e, f, g and h is from 0 to less than 1, satisfying $d+e+f+g+h=1$.

3. The resist composition of claim 2, wherein the acid labile groups in formulae (1) and (2) are selected from: tertiary alkyl groups of 4 to 20 carbon atoms, trialkylsilyl groups in which each alkyl moiety has 1 to 6 carbon atoms, oxoalkyl groups of 4 to 20 carbon atoms, and groups of the formulae (L1) to (L4):

(L1)

(L2)

(L3)

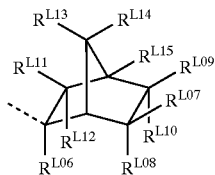
(L4)

wherein, the broken line denotes the point of attachment, $R^{L01}$ and $R^{L02}$ are hydrogen or straight, branched or cyclic alkyl groups of 1 to 18 carbon atoms, $R^{L03}$ is a monovalent hydrocarbon group of 1 to 18 carbon atoms, which may contain a hetero atom, alternatively, a pair of $R^{L01}$ and $R^{L02}$, $R^{L01}$ and $R^{L03}$, or $R^{L02}$ and $R^{L03}$ bond together to form a ring, wherein the pair is a straight or branched alkylene group of 1 to 18 carbon atoms, $R^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1), letter y is an integer of 0 to 6, $R^{L05}$ is a monovalent hydrocarbon group of 1 to 8 carbon atoms, which may contain a hetero atom, or a substituted or unsubstituted aryl group of 6 to 20 carbon atoms, in which some hydrogen atoms are optionally substituted with hydroxyl, alkoxy, carboxy, alkoxycarbonyl, oxo, amino, alkylamino, cyano, mercapto, alkylthio, or sulfo groups, $R^{L06}$ is independently as defined for $R^{L05}$, $R^{L07}$ to $R^{L16}$ independently are hydrogen or monovalent hydrocarbon groups of 1 to 15 carbon atoms, which may contain a hetero atom, and in which some hydrogen atoms are optionally replaced by hydroxyl, alkoxy, carboxy, alkoxycarbonyl, oxo, amino, alkylamino, cyano, mercapto, alkylthio, or sulfo groups; alternatively, two of $R^{L07}$ to $R^{L16}$, taken together, form a ring wherein the pair is a divalent $C_1$–$C_{15}$ hydrocarbon group which may contain a hetero atom; further alternatively, two of $R^{L07}$ to $R^{L16}$ which are attached to a adjoining carbon atoms bond together directly to form a double bond.

4. The resist composition of claim 1, wherein the poly (meth)acrylic acid derivative is a polymer selected from the following formulae:

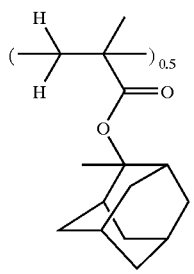

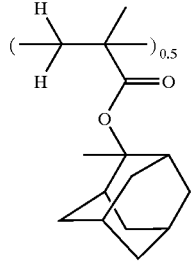

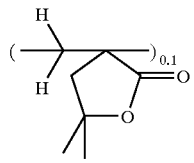

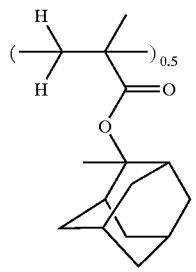

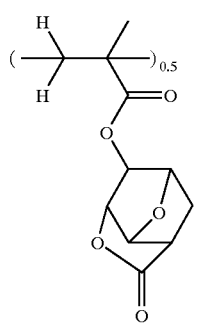

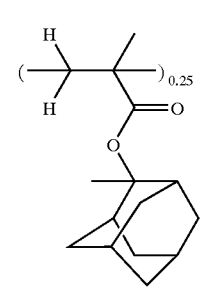

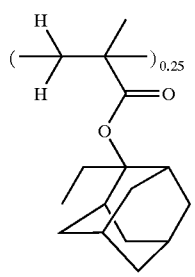

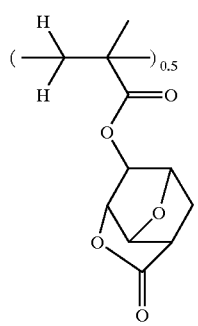

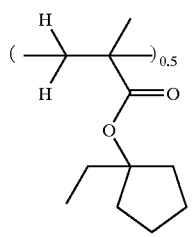

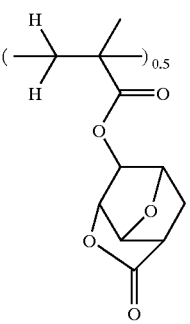

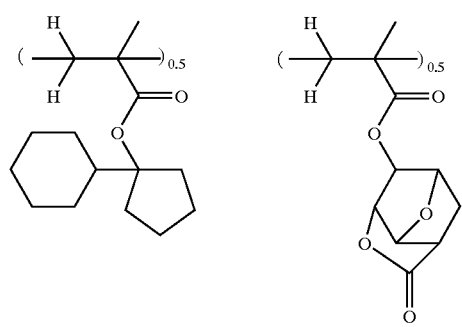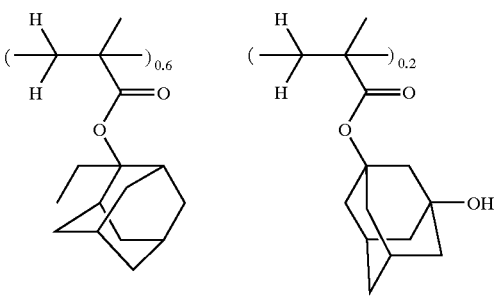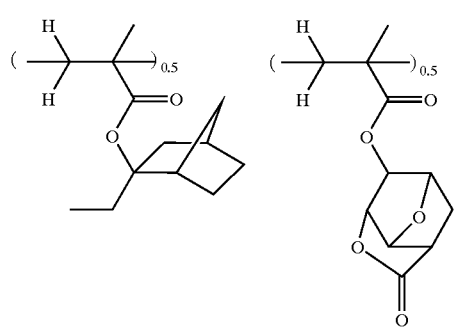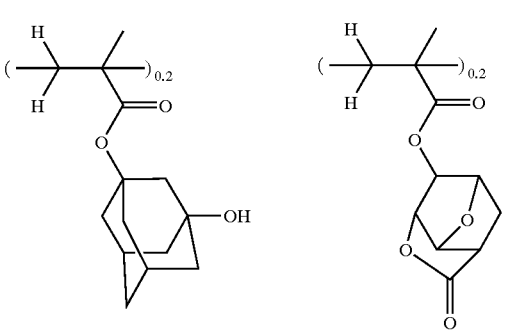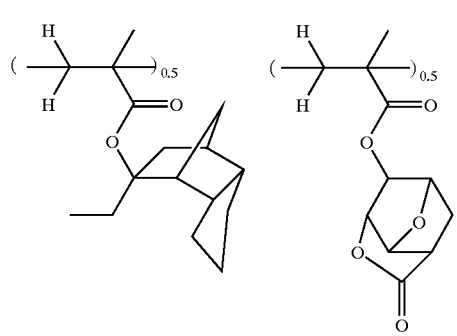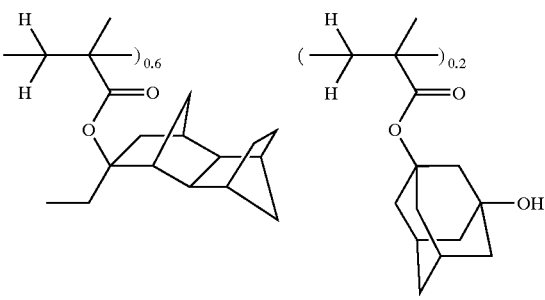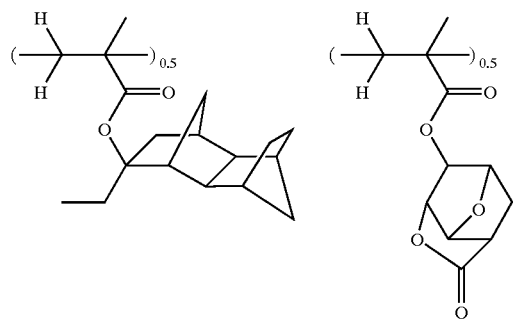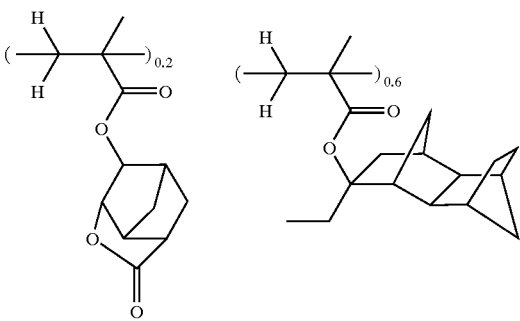

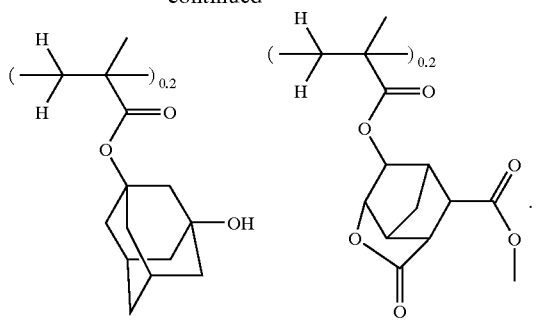

5. The resist composition of claim 1, wherein, in formula (1), "a," "b" and "c" satisfy: $0.1 \leq a \leq 0.9$, $0 \leq b \leq 0.8$, and $0 \leq c \leq 0.8$.

6. The resist composition of claim 1, wherein, in formula (1), "a," "b" and "c" satisfy: $0.2 \leq a \leq 0.8$, $0 \leq b \leq 0.7$, and $0 \leq c \leq 0.7$.

7. The resist composition of claim 1, wherein the acid labile groups in formula (1) are selected from: tertiary alkyl groups of 4 to 20 carbon atoms, trialkylsilyl groups in which each alkyl moiety has 1 to 6 carbon atoms, oxoalkyl groups of 4 to 20 carbon atoms, and groups of the formulae (L1) to (L4):

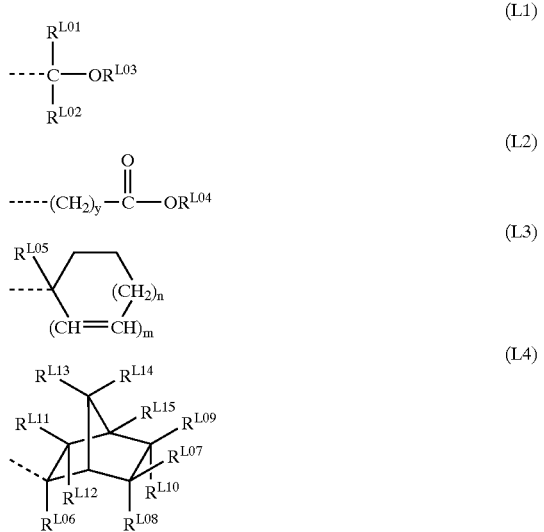

wherein,
the broken line denotes the point of attachment,
$R^{L01}$ and $R^{L02}$ are hydrogen or straight, branched or cyclic alkyl groups of 1 to 18 carbon atoms,
$R^{L03}$ is a monovalent hydrocarbon group of 1 to 18 carbon atoms, which may contain a hetero atom,
alternatively, a pair of $R^{L01}$ and $R^{L02}$, $R^{L01}$ and $R^{L03}$, or $R^{L02}$ and $R^{L03}$ bond together to form a ring, wherein the pair is a straight or branched alkylene group of 1 to 18 carbon atoms, $R^{L04}$ is a tertiary alkyl group of 4 to 20 carbon atoms, a trialkylsilyl group in which each alkyl moiety has 1 to 6 carbon atoms, an oxoalkyl group of 4 to 20 carbon atoms, or a group of formula (L1), letter y is an integer of 0 to 6, $R^{L05}$ is a monovalent hydrocarbon group of 1 to 8 carbon atoms, which may contain a hetero atom, or a substituted or unsubstituted aryl group of 6 to 20 carbon atoms, in which some hydrogen atoms are optionally substituted with hydroxyl, alkoxy, carboxy, alkoxycarbonyl, oxo, amino, alkylamino, cyano, mercapto, alkylthio, or sulfo groups, $R^{L06}$ is independently as defined for $R^{L05}$, $R^{L07}$ to $R^{L16}$ independently are hydrogen or monovalent hydrocarbon groups of 1 to 15 carbon atoms, which may contain a hetero atom, and in which some hydrogen atoms are optionally replaced by hydroxyl, alkoxy, carboxy, alkoxycarbonyl, oxo, amimo, alkylamino, cyano, mercapto, alkylthio, or sulfo groups; alternatively, two of $R^{L07}$ to $R^{L16}$, taken together, form a ring wherein the pair is a divalent $C_1$–$C_{15}$ hydrocarbon group which may contain a hetero atom; further alternatively, two of $R^{L07}$ to $R^{L16}$ which are attached to a adjoining carbon atoms bond together directly to form a double bond.

8. The resist composition of claim 1, wherein the hydrogenated product of the ring-opening metathesis polymer has a weight average molecular weight (Mw) of about 3,000 to 20,000.

9. The resist composition of claim 1, wherein the hydrogenated product of the ring-opening metathesis polymer has a polydispersity index Mw/Mn in a range of 1.0 to 2.0.

10. The resist composition of claim 1, wherein the poly (meth)acrylic acid derivative has a weight average molecular weight (Mw) of about 1,000 to 500,000.

11. The resist composition of claim 1, wherein the poly (meth)acrylic acid derivative has a polydispersity index Mw/Mn in a range of 1.0 to 3.0.

12. The resist composition of claim 1, wherein the hydrogenated product of a ring-opening metathesis polymer and the poly(meth)acrylic acid derivative are provided in the composition in a weight ratio in the range of 90:10 to 10:90.

13. The resist composition of claim 1, wherein the hydrogenated product of a ring-opening metathesis polymer and the poly(meth)acrylic acid derivative are provided in the composition in a weight ratio in the range of 80:20 to 20:80.

14. A process for forming a resist pattern comprising the steps of:
applying the resist composition of claim 2 onto a substrate to form a coating,
heat treating the coating and then exposing it to high-energy radiation or electron beam through a photo mask, and
optionally heat treating the exposed coating and developing it with a developer.

* * * * *